(12) United States Patent
Liu et al.

(10) Patent No.: US 8,642,434 B2
(45) Date of Patent: Feb. 4, 2014

(54) STRUCTURE AND METHOD FOR MOBILITY ENHANCED MOSFETS WITH UNALLOYED SILICIDE

(75) Inventors: Yaocheng Liu, Elmsford, NY (US); Dureseti Chidambarrao, Weston, CT (US); Oleg Gluschenkov, Poughkeepsie, NY (US); Judson R. Holt, Wappingers Falls, NY (US); Renee T. Mo, Briarcliff Manor, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/397,865

(22) Filed: Feb. 16, 2012

(65) Prior Publication Data

US 2012/0149159 A1      Jun. 14, 2012

Related U.S. Application Data

(62) Division of application No. 11/619,809, filed on Jan. 4, 2007, now Pat. No. 8,217,423.

(51) Int. Cl.
*H01L 21/336* (2006.01)
*H01L 21/8238* (2006.01)

(52) U.S. Cl.
USPC ............. 438/300; 257/E33.01; 257/E33.009; 257/E31.036; 257/E31.035; 257/E21.634; 257/619; 257/18; 257/19; 257/22; 257/E21.619; 438/655; 438/656; 438/682; 438/683

(58) Field of Classification Search
None
See application file for complete search history.

(56) References Cited

U.S. PATENT DOCUMENTS

| | | | |
|---|---|---|---|
| 5,441,901 A | | 8/1995 | Candelaria |
| 6,156,654 A | * | 12/2000 | Ho et al. ................... 438/683 |
| 6,689,671 B1 | | 2/2004 | Yu et al. |
| 6,716,708 B2 | | 4/2004 | Cabral et al. |
| 6,890,823 B2 | | 5/2005 | Lee et al. |
| 7,122,435 B2 | * | 10/2006 | Chidambaram et al. ...... 438/303 |

(Continued)

FOREIGN PATENT DOCUMENTS

| | | |
|---|---|---|
| JP | 2004095639 A | 3/2004 |
| JP | 2006186240 A | 7/2006 |

(Continued)

OTHER PUBLICATIONS

Information Materials for IDS dated Sep. 18, 2012, prepared by Jerry Liu; TIPO Office Action dated Aug. 24, 2012.

(Continued)

*Primary Examiner* — Julio J Maldonado
*Assistant Examiner* — Mohammad Choudhry
(74) *Attorney, Agent, or Firm* — Scully, Scott, Murphy & Presser, P.C.; Yuanmin Cal

(57) ABSTRACT

While embedded silicon germanium alloy and silicon carbon alloy provide many useful applications, especially for enhancing the mobility of MOSFETs through stress engineering, formation of alloyed silicide on these surfaces degrades device performance. The present invention provides structures and methods for providing unalloyed silicide on such silicon alloy surfaces placed on semiconductor substrates. This enables the formation of low resistance contacts for both mobility enhanced PFETs with embedded SiGe and mobility enhanced NFETs with embedded Si:C on the same semiconductor substrate. Furthermore, this invention provides methods for thick epitaxial silicon alloy, especially thick epitaxial Si:C alloy, above the level of the gate dielectric to increase the stress on the channel on the transistor devices.

14 Claims, 23 Drawing Sheets

(56) References Cited

U.S. PATENT DOCUMENTS

| | | |
|---|---|---|
| 7,202,122 B2 | 4/2007 | Huang et al. |
| 7,288,828 B2 | 10/2007 | Lin et al. |
| 8,217,423 B2 | 7/2012 | Liu et al. |
| 2002/0045317 A1 | 4/2002 | Oishi et al. |
| 2005/0035369 A1 | 2/2005 | Lin et al. |
| 2005/0048732 A1 | 3/2005 | Park et al. |
| 2005/0082616 A1 | 4/2005 | Chen et al. |
| 2005/0104131 A1 | 5/2005 | Chidambarrao et al. |
| 2005/0130358 A1 | 6/2005 | Chidambarrao et al. |
| 2006/0255365 A1 | 11/2006 | Ko et al. |

FOREIGN PATENT DOCUMENTS

| | | |
|---|---|---|
| JP | 2006253317 A | 9/2006 |
| JP | 2006261283 A | 9/2006 |
| WO | 2005112577 A2 | 12/2005 |

OTHER PUBLICATIONS

Information Materials for IDS dated Dec. 26, 2012, JPO Office Action, dated Nov. 27, 2012 for Application 2009544879.

Ernst, T., et al., "Fabrication of a novel strained SiGe:C-channel planar 55nm nMOSFET for High-Performance CMOS" VLSI Symposium (Aug. 2002) pp. 92-93.

Cheng, Z. et al. "Electron Mobility Enhancement in Strained-Si n-MOSFETs Fabricated on SiGe-on-Insulator (SGOI) Substrates" IEEE Electron Device Letters (Jul. 2001) pp. 321-323, vol. 22.

Ghani, T., et al., "A 90nm High Volume Manufacturing Logic Technology Featuring Novel 45nm Gate Length Strained Silicon CMOS Transistors" Proc. IEDM (Dec. 8-10, 2003) pp. 978-980.

Ang, K. et al. "Thin Body Silicon-on-Insulator N-MOSFET with Silicon-Carbon Source/Drain Regions for Performance Enhancement" IEEE International Electron Device Meeting 2005 (Dec. 2005) pp. 503-506.

Pey, K. L. "Thermal Reaction of nickel and Si0.75Ge0.25 alloy" J. Vac. Sci. Technol. A (Nov./Dec. 2002) pp. 1903-1910, vol. 20, No. 6.

U.S. Office Action dated Feb. 15, 2013 issued in U.S. Appl. No. 13/397,860.

Letter from IBM Japan which indicates that the date of the issued Office Action is Jul. 2, 2013.

\* cited by examiner

STRUCTURE AND METHOD FOR MOBILITY ENHANCED MOSFETS WITH UNALLOYED SILICIDE

CROSS REFERENCE TO RELATED APPLICATION

This application is a divisional of U.S. patent application Ser. No. 11/619,809, filed Jan. 4, 2007 the entire content and disclosure of which is incorporated herein by reference.

FIELD OF THE INVENTION

The present invention relates to semiconductor devices and methods of manufacture, and particularly, to complementary metal oxide semiconductor (CMOS) transistors with stress in the channels.

BACKGROUND OF THE INVENTION

Each new generation of semiconductor technology demands higher performance in semiconductor devices, particularly in the performance of CMOS transistors. One of the key metrics of transistor performance is the on-current of the transistor per unit width, typically measured in hundreds of microamperes per micron of the channel width, or "gate width" as it is commonly referred to. Various methods have been considered and practiced to enhance the on-current of the CMOS transistors, that is, both PFETs (transistors wherein the minority carriers are holes, which are p-type carriers), and NFETs (transistors wherein the minority carriers are electrons, which are p-type carriers). Among them, improving the mobility of minority carriers in the channel is the most common method of enhancing the on-current of the CMOS transistors. Some of these methods utilize inherent differences in the mobility of carriers along the different crystallographic orientations of the semiconductor crystal, while some others utilize the changes in the mobility of the carriers under stress in the plane of the channel.

In the case of the latter, wherein stress within the channel of a CMOS transistor is altered, a few different approaches exist. According to a first approach, the semiconductor lattice is implanted with atoms with similar electronic properties but with different lattice constants. All of silicon, germanium, and carbon have identical electronic outer shells and the same crystal structure, namely, "the diamond structure," with their room temperature lattice constants of 0.5431 nm, 0.565 nm, and 0.357 nm, respectively. Substitution of some of the atoms in a crystal that are made up of one type of atoms with atoms of different species fabricates a crystal with an altered natural lattice constant from that of the original crystal. Natural lattice constant herein denotes the lattice constant of the material when no stress is applied externally. For the purposes of silicon based semiconductor devices, silicon crystals with a small percentage of carbon or germanium in substitutional sites are commonly used. When substitutional alloys of such materials are epitaxially disposed on a silicon substrate, stress is applied to the material since the alloy is now forced to have the same lattice constant as the underlying silicon instead of its own natural lattice constant. However, as demonstrated in FIG. 9 in Ernst et al., "Fabrication of a novel strained SiGe: C-channel planar 55 nm n-MOSFET for High-Performance CMOS," VLSI Symp., 2002, pp. 92-93, the substitutional atoms in the alloy serve as scattering centers and actually degrade the mobility. Similar problems are encountered with substitutional alloys of silicon and germanium.

A second approach is to build the channel of a CMOS transistor on a silicon layer that is epitaxially deposited on a crystalline silicon alloy with an altered lattice constant different from that of silicon. Specifically, the silicon layer is constructed essentially with silicon, having a low level of electrical doping as necessary but does not contain a silicon carbon alloy or a silicon germanium alloy to avoid the problems of the first approach. However, the substrate itself has an altered lattice constant. For example, a smaller lattice constant compared with that of silicon is achieved by alloying silicon with a small percentage of carbon, e.g., between 0% and 10% in atomic concentration. In this alloy, the carbon atoms are placed substitutionally, that is, replacing the silicon atoms from the structure of the crystal, as opposed to interstitially, that is, by being placed between the sites that the original silicon atoms are still occupying. In another example, a larger lattice constant compared with that of silicon is achieved by alloying silicon with germanium, e.g. between 0% and 40% in atomic concentration. In the process of manufacturing these devices, a substrate with an altered lattice constant is formed first, followed by the formation of a strained silicon layer through epitaxial deposition of silicon. Cheng et al., "Electron Mobility Enhancement in Strained-Si n-MOSFETs Fabricated on SiGe-on Insulator (SGOI) Substrates," IEEE Electron Device Letters, Vol. 22, No. 7, July 2001 demonstrates an example of such an approach with improvement in the performance of PFETs.

While the second approach does produce devices with improved performance, such an approach faces some challenges in that the formation of a crystalline structure with an altered lattice parameter generally depends on the structural relaxation of the epitaxially grown alloy material, be it an alloy of silicon and germanium or an alloy of silicon and carbon, through the generation of misfit dislocations, which are crystalline defects in thick films. When the film is thin, the epitaxial alignment of the alloy to the underlying silicon substrate is preserved, therefore keeping the lattice constant in the plane of the epitaxial growth exactly the same as the underlying silicon substrate. Only when the alloy becomes thicker does the alloy relax and its lattice constant approaches the natural value for the alloy. Typically, the thickness required for full relaxation and reduction of the crystalline defects in the alloy to an acceptable level is on the order of 1,000 nm. Methods of improving the film quality is also known in the prior art.

As far as the performance of the CMOS transistors built with silicon channels are concerned, NFETs and PFETs require the opposite kind of stress. Specifically, the hole mobility is enhanced in a PFET when a compressive stress is applied to the channel along the direction of the movement of the holes, that is, in the direction of a line connecting the source and the drain. However, the electron mobility is enhanced in an NPFET when a tensile stress is applied to the channel along the direction of the movement of the electrons. Manufacturing both PFETs and NFETs with enhanced mobility through stress engineering on the same substrate, therefore, creates a challenge in that two types of substrate areas with an altered lattice parameter need to be fabricated. Such methods have been disclosed in the prior art, for example, in the U.S. Patent Application Publication No. US2005/0104131 A1 and in the U.S. Patent Application Publication No. US2005/0130358 A1. However, the general complexity of such processes still remains a challenge.

A third type of approach produces stress in the channel region by embedding an epitaxial alloy of silicon and carbon or, of silicon and germanium, within the source and the drain region of a transistor. Hence, they are called embedded epitaxial alloys. The most common choice of material includes an epitaxial silicon germanium alloy and epitaxial silicon carbon alloy (Si:C) on silicon substrates. According to this approach, the vertical dimensions of the alloy material in the source and the drain are much less than what is required for the alloy to generate misfit locations and relax. So the alloy material within the source and the drain maintains epitaxial alignment with the underlying silicon substrate. The lattice constant in the plane of the epitaxial alignment, which is the same as the plane in which the channel is located, remains identical to the lattice constant of the underlying silicon substrate. Since the alloy in the source and the drain has a different lattice constant than the natural lattice constant of the alloy, stress is exerted on the alloy itself and the alloy in turn exerts stress on the surrounding structures. The channel of the transistor located between a source and the drain is consequently stressed.

As noted above, the desired type of stress is different between NFET channels and PFET channels. For PFETs, the desired stress is a compressive stress along the direction of the line connecting the source and the drain. An epitaxial alloy of silicon and germanium in the source and the drain exerts such uniaxial stress on the channel. Ghani et al., "A 90 nm high Volume manufacturing Logic Technology Featuring Novel 45 nm Gate Length Strained Silicon CMOS Transistors," Proc. IEDM, pp. 978-980, 2003 reported a successful implementation of this technology for the improvement of PFET performance. Likewise, NFETs require a tensile stress along the direction of the line connecting the source and the drain. An epitaxial alloy of silicon and carbon in the source and drain exerts such stress on the channel. Ang et al., "Thin Body Silicon-on-insulator N-MOSFET with Silicon-Carbon Source and drain regions for Performance Enhancement," IEEE International Electron Device Meeting 2005, December 2005, pp. 503-506 reported improved NFET performance through the use of this technology.

As in the case of the second approach discussed above, a successful implementation of both PFETs and NFETs with enhanced mobility through stress engineering on the same silicon substrate requires a complex integration of processing steps. The U.S. Patent Application Publication No. US 2005/0082616 A1 discloses methods and structures of implementing particular versions of the PFETs and NFETs with enhanced mobility through stress engineering. In summary, for each type of CMOS transistors, the source and the drain regions of the transistors are etched and silicon alloys are epitaxially grown within the etched region. The masking of one type of transistors and etching of the other type of transistors are performed sequentially. Also, the silicon alloy material for each type of transistors is selected appropriately so that the stress exerted on the channel of the transistors enhances the mobility of the minority carriers in the channel.

During the research leading to the present invention, some problems in the manufacturing of enhanced mobility transistors as disclosed in Chen et al., have been discovered. The first problem is a degradation of contact resistance on SiGe alloy. As the content of germanium increases, the contact resistance to the source and drain also tends to increase and degrade the performance of PFETs with embedded SiGe alloy in the source and the drain. This is because the alloy of metal silicide and metal germanide, which is formed by depositing a metal on the source and drain containing silicon and germanium and annealing the structure during the contact formation process, has inferior contact resistance to unalloyed metal silicide, that is, a metal silicide without any metal germanide mixed within. An example of an agglomeration triggered increase in the sheet resistance of the alloy of silicide and germanide was reported in Pey et al., "Thermal Reaction of nickel and $Si_{0.75}Ge_{0.25}$ alloy," J. Vac. Sci. Technol. A 20(6), November/December 2002, pp. 1903-1910, after an anneal above 700° C. in the alloy of nickel and $Si_{0.75}Ge_{0.25}$.

It has also been discovered during the course of research leading to the present invention that selective epitaxial growth of Si:C alloy produces a very rough surface with multiple facets. Metal silicides formed upon such surfaces have degraded performance compared to normal silicide formed on flat surface containing no carbon. Whatever the mechanism for this degradation may be, the selective Si:C epitaxial growth process currently available in the industry produces Si:C alloy surfaces which produces inferior silicide with higher contact resistance compared to a flat silicon surface containing no carbon.

Furthermore, it has been discovered that not only the reaction rate of the Si:C selective epitaxy process is very slow, but there is also a limit on the thickness of the Si:C films that can be grown by selective epitaxy process currently available in the industry. Apparently, the incorporation of carbon into silicon changes some of the reaction mechanism of conventional silicon epitaxy causing the thickness of the epitaxially grown Si:C film saturates in time. This means that the increase in the height of the source and the drain through the use of Si:C selective epitaxy has a limit, and that Si:C selective epitaxy is not conducive to manufacturing of NFET structures with highly raised source and drain relative to the height of the gate dielectric.

Therefore, there exists a need for a semiconductor structure and methods that produce stable and low contact resistance on SiGe alloy surfaces.

There exists another need for a semiconductor structure and methods that produce stable and low contact resistance on Si:C alloy surfaces.

Also, there exists a need for a semiconductor structure and methods that produce a thick epitaxial silicon alloy, especially a thick epitaxial Si:C alloy, above the level of the gate dielectric.

Finally, there exists a need for a semiconductor structure and methods that provide stable low resistance contacts for both mobility enhanced PFETs with embedded SiGe and mobility enhanced NFETs with embedded Si:C on the same semiconductor substrate.

SUMMARY OF THE INVENTION

The present invention addresses the needs describe above by providing structures and methods for providing stable and low contact resistance on SiGe alloy surfaces and Si:C alloy surfaces.

Specifically, the present invention addresses the needs described above by providing an epitaxially grown silicon layer on top of the epitaxially grown silicon alloys, be it a silicon germanium alloy for PFETs or an Si:C alloy for NFETs, embedded in the source and drain regions of the transistors. The epitaxially grown silicon layer, which is essentially free of germanium or carbon, produces an unalloyed silicide that does not contain any metal germanide or metal carbide.

The present invention also enables manufacture of a thick epitaxial silicon alloy, especially a thick epitaxial Si:C alloy, above the level of the gate dielectric.

Furthermore, the present invention provides semiconductor structures and methods for providing stable low contact resistance while providing mobility enhancement for both types of transistors on the same substrate.

While the present invention is described with a silicon on insulator (SOI) substrate, it should be recognized that the present invention can equally well be practiced on a bulk substrate, a silicon substrate with a thick deposited and relaxed layer of material as an $Si_{1-x}Ge_x$ layer, an $Si_{1-x}C_x$ layer, or an $Si_{1-x-y}Ge_xC_y$ layer on the top of the substrate with some modifications. In most cases, the adjustment involves increasing or decreasing either the carbon content or germanium content during the formation of epitaxially grown sources and drains. In limiting cases where either the carbon concentration or germanium concentration approaches zero, and where either the silicon carbon alloy is replaced by pure silicon or the silicon germanium alloy is replaced by pure silicon, the present invention is also applicable as long as there is one silicon alloy present in at least one part of the sources and drains of either type of FETs.

The currently prevalent contact formation method in the semiconductor industry utilizes a blanket deposition of metal, such as nickel, nickel platinum alloy, cobalt, tantalum, tungsten, molybdenum, and titanium. This is followed by at least one thermal anneal process to facilitate the reaction of the deposited metal with the semiconductor material, including that in the source region and drain region of transistors. The prior art on the formation of carrier mobility enhanced transistors through stress engineering provides a silicon germanium alloy or silicon carbon alloy that is embedded in the source region and the drain region of transistors. According to the prior art, the metal that is deposited over the source region and the drain region for the formation of contacts reacts with the silicon germanium alloy or the silicon carbon alloy.

The interaction of the silicon alloy with the metal alters the composition of the material in the contact due to the introduction of other semiconductor material than silicon, such as carbon or germanium. When a silicon carbon alloy interacts with metal, the presence of carbon interferes with the silicide formation process. The resulting material after reaction is a mixture of metal silicide and metal carbide, metal silicide and carbon, or metal silicide, carbon, and metal carbide. The presence of other material than metal silicide and the resulting reduction in the grain size of the metal silicide contribute to the reduction in the conductivity, that is, the increase in the resistivity, of the contact material. In the case of a silicon germanium alloy, the presence of germanium results in the introduction of metal germanide into the contact material. As in the case of silicon carbon alloy, the mixture of metal silicide and metal germanide results in the reduction in the conductivity of the contact material.

The needs stated above are addressed by the methods and structures of the present invention which includes providing a silicon material onto the surface of the source and drain region before the formation of silicide.

According to a first group of embodiments in the present invention, a silicon germanium alloy and a silicon carbon alloy are first formed within the source and drain regions of transistors. Preferably, epitaxial silicon germanium alloy is embedded into the PFETs and epitaxial silicon carbon alloy is embedded into the NFETs. In general, the incorporation of the silicon germanium alloy material precedes the incorporation of silicon carbon alloy material into the silicon substrate. Preferably, the epitaxial silicon germanium alloy has a content of germanium that is greater than 0% and less than 40%. The third through sixth embodiments of the present invention in the first group, however, do allow the reversal of this order as will be described herein below.

The incorporation of the carbon into the silicon material to form an epitaxial silicon carbon alloy may be performed through conventional selective epitaxy of silicon with carbon doping as described in Chen et al., or alternatively, performed by carbon implantation followed by an anneal. The latter is preferred for the ease and simplicity of the process methods. In both cases, the area over which the formation of silicon carbon alloy is not desired is masked to prevent unwanted silicon carbide alloys. After a carbon implantation process, the carbon atoms are incorporated into the existing crystalline structure as they move into substitutional sites during an anneal to form an Si:C alloy. Preferably, the epitaxial silicon carbon alloy has a content of carbon that is greater than 0% and less than 10% to help ensure the epitaxial structure of the alloy. Also, preferably, the anneal process for the incorporation of the carbon into the substitutional sites is a laser anneal with a peak temperature between 700° C. and 1428° C.

After the embedded silicon carbon alloy and the embedded silicon germanium alloy are introduced into the structures of the transistors, a silicon material that is essentially free of carbon or germanium is deposited by a selective silicon deposition process over the silicon alloys, including those in the source region and the drain region. Preferably, the selective silicon deposition process is a selective silicon epitaxy due to the advantageous nature of the epitaxial alignment of the new silicon material to the underlying crystal structure. The present invention is therefore described utilizing selective silicon epitaxy. However, alternative silicon deposition processes that are not a selective silicon epitaxy are also contemplated herein.

The doping of the source and drain for both PFETs and NFETs may be performed at any point after formation of the embedded silicon germanium alloy and before deposition of metal for the sake of contact formation. This point is further illustrated below in the Detailed Summary of the Invention.

Metal is thereafter deposited on the surfaces of the source and drain regions of both PFETs and NFETs. All of these surfaces now contain silicon material, whether doped with conventional electrical dopants such as boron, antimony, phosphorus, and arsenic or undoped as pure silicon material. The silicon material in the source and drain regions must be contrasted with any silicon alloy material in the prior art, such as silicon carbon alloy or silicon germanium alloy, whether doped with conventional electrical dopants or not. Prior art provides silicon alloy surfaces for contact formation on transistors with embedded silicon germanium alloy in the source and drain regions. According to the first group of embodiments of the present invention, all semiconductor surfaces that come into contact with the deposited metal for the sake of contact formation contain essentially no carbon or germanium.

According to the first group of embodiments of the present invention, the newly formed silicon layer produces pure metal silicide during the contact formation process. This metal silicide is not alloyed with any other material such as carbon, metal carbide, or metal germanide. For the exclusion of other material that would adversely impact the conductivity of the contacts, the silicide material according to the first group of embodiment of the present invention is herein referred to as "unalloyed silicide." It should be understood that above exclusion does not mean an exclusion of conventional electrical dopants, such as boron, antimony, phosphorus, and arsenic, which have long been used in the semiconductor industry to electrically dope silicon to increase its conductivity. The exclusion referred to other contact materials such as metal germanide, metal carbide, and carbon that affect the contact resistance adversely. It is possible for the silicon material in the newly formed silicon layer to be doped with conventional electrical dopants listed above. The newly formed silicon layer is, however, essentially free of carbon, metal carbide, or metal germanide.

Selective silicon epitaxy is preferably used for the selective silicon deposition as noted above. The resulting structure according to the first group of the present invention is as follows. If the metal deposited during the silicide formation process does not consume all of the silicon material in the newly formed silicon layer, the resulting structure for each of the source and drain regions includes a stack that contains an unalloyed metal silicide, an epitaxial silicon layer, and an epitaxial silicon alloy layer. If the metal deposited during the silicide formation process consumes all of the silicon material in the newly formed silicon layer, the resulting structure for each of the source and drain regions includes a stack that contains an unalloyed metal silicide and an epitaxial silicon alloy layer. The epitaxial silicon alloy layer is embedded into the body of the transistor structure.

According to a second group of embodiments in the present invention, the needs stated above are also addressed by providing a silicon material onto the surface of the source region and the drain region before the formation of silicide. In this case, an embedded silicon germanium alloy must be introduced into the source and drain regions of the transistors, if at all. Preferably, the embedded silicon germanium epitaxial alloy is embedded into the source and drain regions of the PFETs while the source and drain regions of the NFETs contain only silicon at this point.

Thereafter, a silicon material that is essentially free of carbon or germanium is deposited by a selective silicon deposition process over the silicon and silicon germanium alloy to form a new silicon layer. Since no carbon has been intentionally introduced into the source and drain regions of any transistor up to this point, the newly formed silicon layer are completely free of carbon at this point. Also, the silicon material in the newly formed silicon layer is "essentially" free of germanium since the reactants in the silicon selective epitaxy process provide only silicon material onto the existing silicon alloy surfaces. Also, compared to the rate of surface diffusion which must occur for a successful epitaxy process, the rate of bulk diffusion for germanium at a typical temperature of the silicon selective epitaxy is much lower and therefore, only a small amount of germanium, often a trace amount, diffuses into the newly formed silicon layer through the interface between the silicon germanium alloy layers and the new silicon layer. Any other material in the silicon layer that are newly formed by selective silicon epitaxy is only in minute quantities and therefore, the silicon layer can be considered essentially free of carbon or germanium at this point.

According to the second group of embodiments of the present invention, Si:C alloy is thereafter formed through conventional selective epitaxy of silicon with carbon doping as described in Chen et al., or alternatively, performed by carbon implantation followed by an anneal. The latter is preferred for the ease and simplicity of the process. The details of the process methods for the formation of silicon carbon alloy are identical to the methods described above for the same purpose according to the first group of embodiments.

As with the first group of embodiments, the doping of the source and drain regions for both PFETs and NFETs may be performed at any point after the formation of the embedded silicon germanium alloy and before the deposition of metal for contact formation.

Metal is thereafter deposited on the surface of the source and drain regions of both PFETs and NFETs. In contrast to the first group of embodiments, two varieties of semiconductor surfaces exist at this point. The first variety of surfaces is the surfaces of a silicon layer deposited over the silicon germanium alloy, whether doped with conventional electrical dopants such as boron, antimony, phosphorus, and arsenic or undoped as pure silicon material. This is in contrast with a silicon alloy material, such as a silicon carbon alloy or a silicon germanium alloy, whether doped with conventional electrical dopants or not. Preferably, the first variety of surfaces is formed in the PFET area. The second variety of surfaces are the surfaces of Si:C alloy, whether doped with conventional electrical dopants such as boron, antimony, phosphorus, and arsenic or undoped as pure silicon material, on which metal is deposited for contact formation. The second variety of surfaces does contain carbon. Preferably, the second variety of surfaces is formed in the NFET area.

The second group of embodiments provides unalloyed silicide only over the silicon germanium alloy but not over the Si:C alloy. As with the first group of embodiments, the second group of embodiments also increases the height of the source and the drain, as defined by the interface between the contact material and the semiconductor material, significantly higher than an equivalent structure that does not utilize a selective silicon deposition during the process flow. However, since all the material deposited by selective silicon deposition turned into silicon carbon alloy under the second variety of surfaces, given the same thickness for the newly grown silicon layer, the amount of silicon carbon alloy above the gate dielectric is more according to the second group of embodiments than the corresponding amount according to the first group of embodiments. Hence, the stress enhancement is more on devices with embedded silicon carbon alloy according to the second group of embodiments.

Selective silicon epitaxy is preferably used for the selective silicon deposition as noted above. The resulting structure according to the second group of the present invention is as follows. If the metal deposited during the silicide formation process does not consume all of the silicon material in the newly formed silicon layer, the resulting structure for the source and drain regions formed with embedded silicon germanium alloy includes a stack that contains an unalloyed metal silicide, an epitaxial silicon layer, and an epitaxial silicon germanium alloy layer. If the metal deposited during the silicide formation process consumes all of the silicon material in the newly formed silicon layer, the resulting structure for the source and drain regions formed with embedded silicon germanium alloy includes a stack that contains an unalloyed metal silicide and an epitaxial silicon alloy layer.

DETAILED DESCRIPTION OF THE INVENTION

Figure 1:
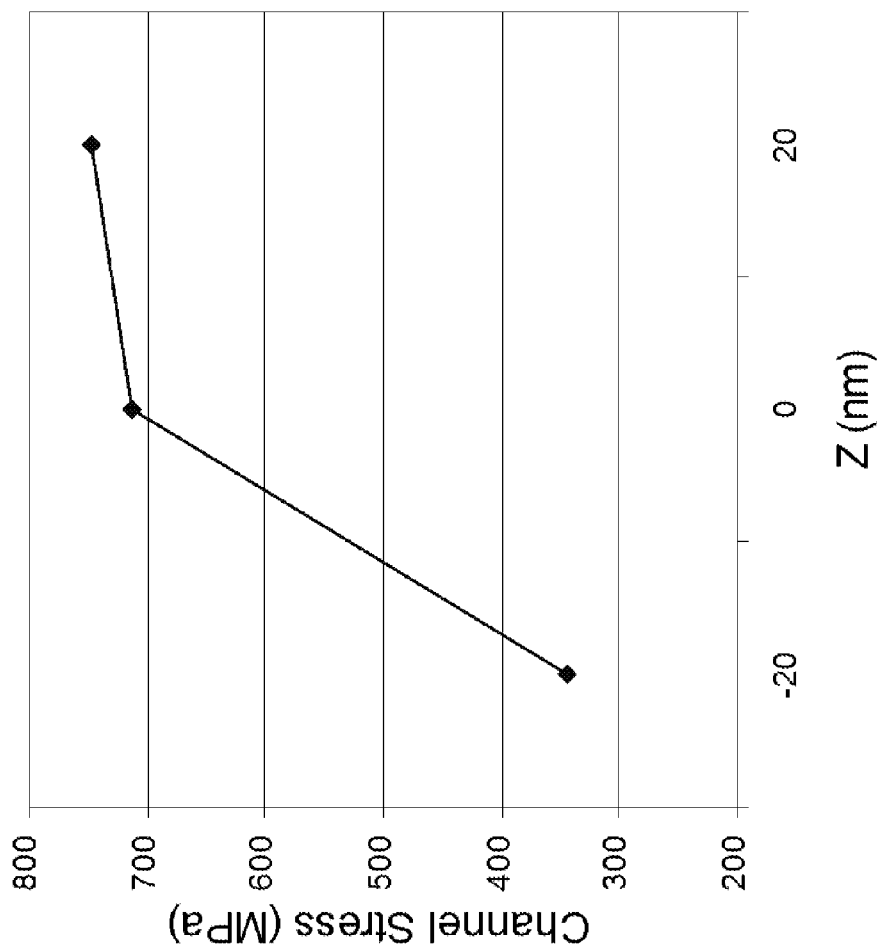
FIG. 1 is a graph showing the results of a simulation for the stress in the channel as a function of the height of the top of an epitaxially grown silicon carbon material in the source and drain regions.

Before describing the present invention in detail, a discussion on the advantage of increased height of the source and drain is provided. The height of the source and drain is defined as the vertical distance between the interface of the contact material and the semiconductor material and the interface between the gate dielectric and the channel. FIG. 1 is the result of a simulation wherein the uniaxial stress along the direction of the channel in an NFET with embedded epitaxial silicon carbon in the source and drain is plotted as a function of the height Z of the source and drain. A positive number for Z implies that the interface between the contact material, containing metal silicide, carbon, and metal carbide, and the embedded silicon carbon alloy in the source and drain is higher than the interface between the gate dielectric and the channel. A negative number for Z implies the opposite. As is obvious from the simulation results, the higher the interface between the silicon carbon alloy and the contact material, the higher the stress, hence the higher the degree of enhancement of the mobility of electrons.

This point is relevant to the present invention in that structures that produces more positive Z, that is, those wherein the contact material is located higher than and farther away from the channel is advantageous for enhancing electron mobility. Both groups of the present invention achieve this advantage.

The present invention has twelve embodiments. Despite the high number of embodiments, however, all of these embodiments share common processes and features. Therefore, the present invention is described in detail for the first embodiment. Thereafter, the differences among the different embodiments of the preset invention are compared and described.

In typical CMOS processing, some areas of the surface of the semiconductor substrate are used for building PFET structures. These areas are collectively called "the PFET area" herein. Similarly, some other areas of the surface of the semiconductor substrate are used for building NFET structures. They are collectively called "the NFET area herein". An exemplary PFET structure in the PFET area and an exemplary NFET structure in the NFET area at various stages of the manufacturing sequences are described for the description of the present invention herein.

Figure 2:
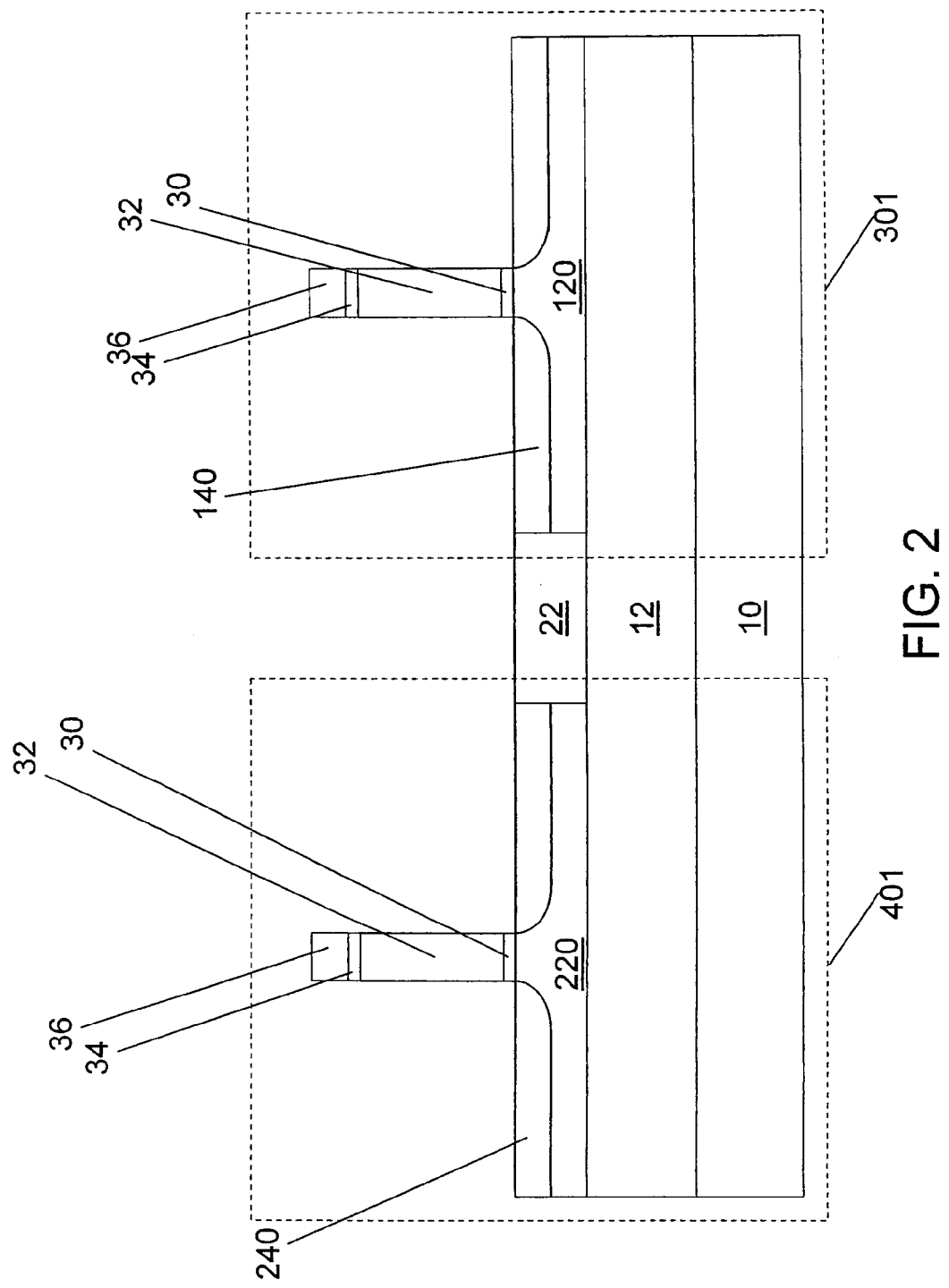
FIGS. 2-11 are sequential vertical cross-sectional views of a pair of an NFET and a PFET according to the first and second embodiments of the present invention.

Referring to FIGS. 2-12, the structures according to the first embodiment of the present invention are sequentially shown in various stages of manufacturing. FIG. 2 shows a schematic vertical cross section of a PFET structure 301 and an NFET structure 401 immediately after the formation of gate patterns by lithography and etching. The substrate consists of a semiconductor substrate 10, a buried oxide layer 12, the body 120 of a PFET structure 301, the body 220 of an NFET structure 401, regions with PFET extension implant 140, regions with NFET extension implant 240, and shallow trench isolation (STI) 22 that separates the PFET structure 301 and the NFET structure 401. A gate stack comprising a gate dielectric 30, gate polysilicon 32, a gate cap oxide 34, and a gate nitride layer 36 is also provided within each of the PFET structure 301 and the NFET structure 401. As is known in the art, the exact composition of the gate stack may be altered to optimize transistor performance. The apparent overlap of the PFET region 301 or the NFET region 401 with STI 22 is incidental and only for the sake of depicting the entirety of the body of the transistor clearly within each transistor structure. STI does not belong to either the PFET structure 301 or the NFET structure 401.

The body 120 of the PFET structure 301 and the regions with PFET extension implant 140 are comprised of crystalline silicon that maintains contiguous single crystalline structure among adjacent elements unless separated by STI 22. Similarly, the body 220 of the NFET structure 401 and the regions with NFET extension implant 240 are also comprised of crystalline silicon that maintains contiguous single crystalline structure among adjacent elements unless separated by STI 22.

Figure 3:
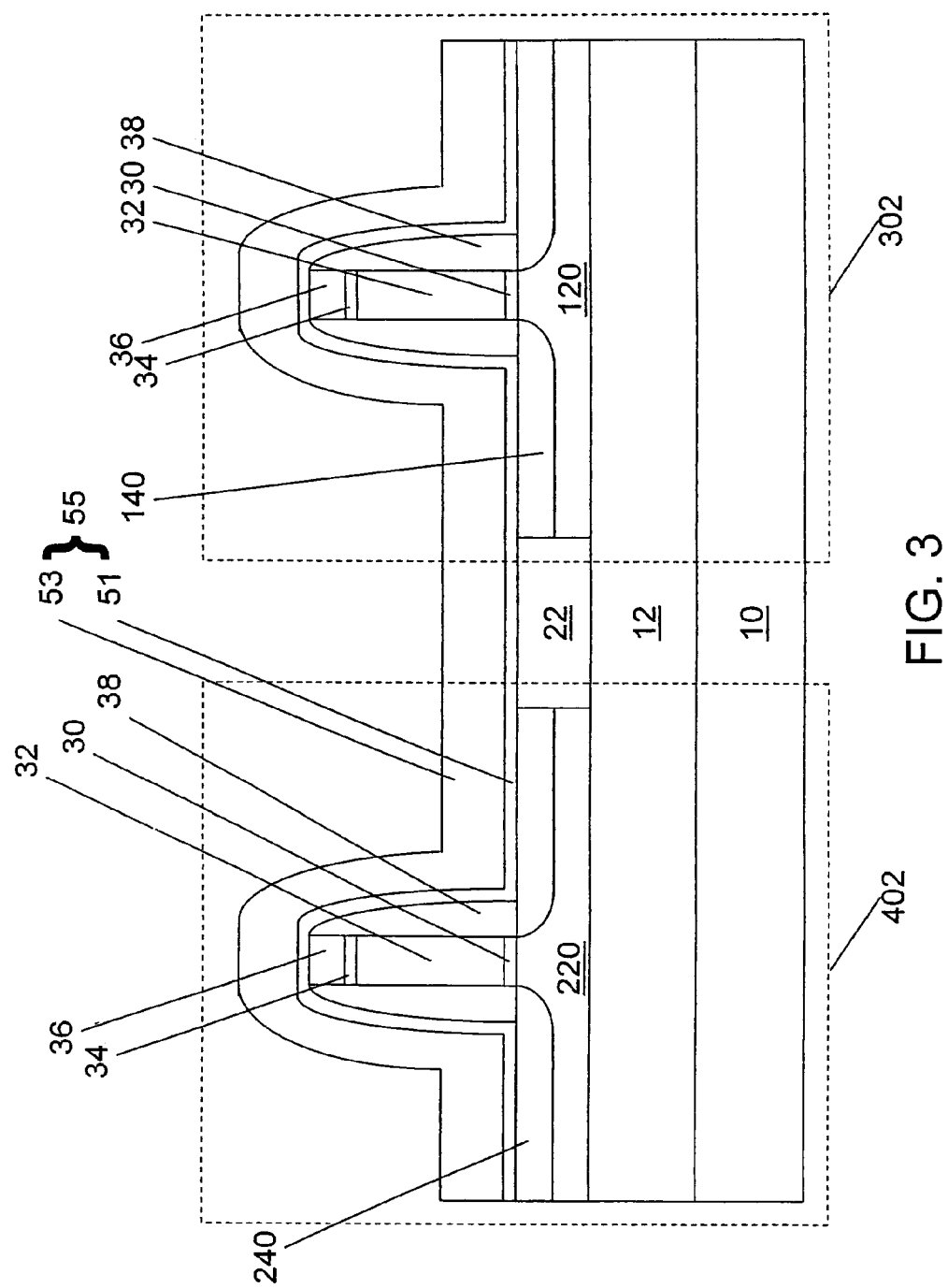
Figure 4:
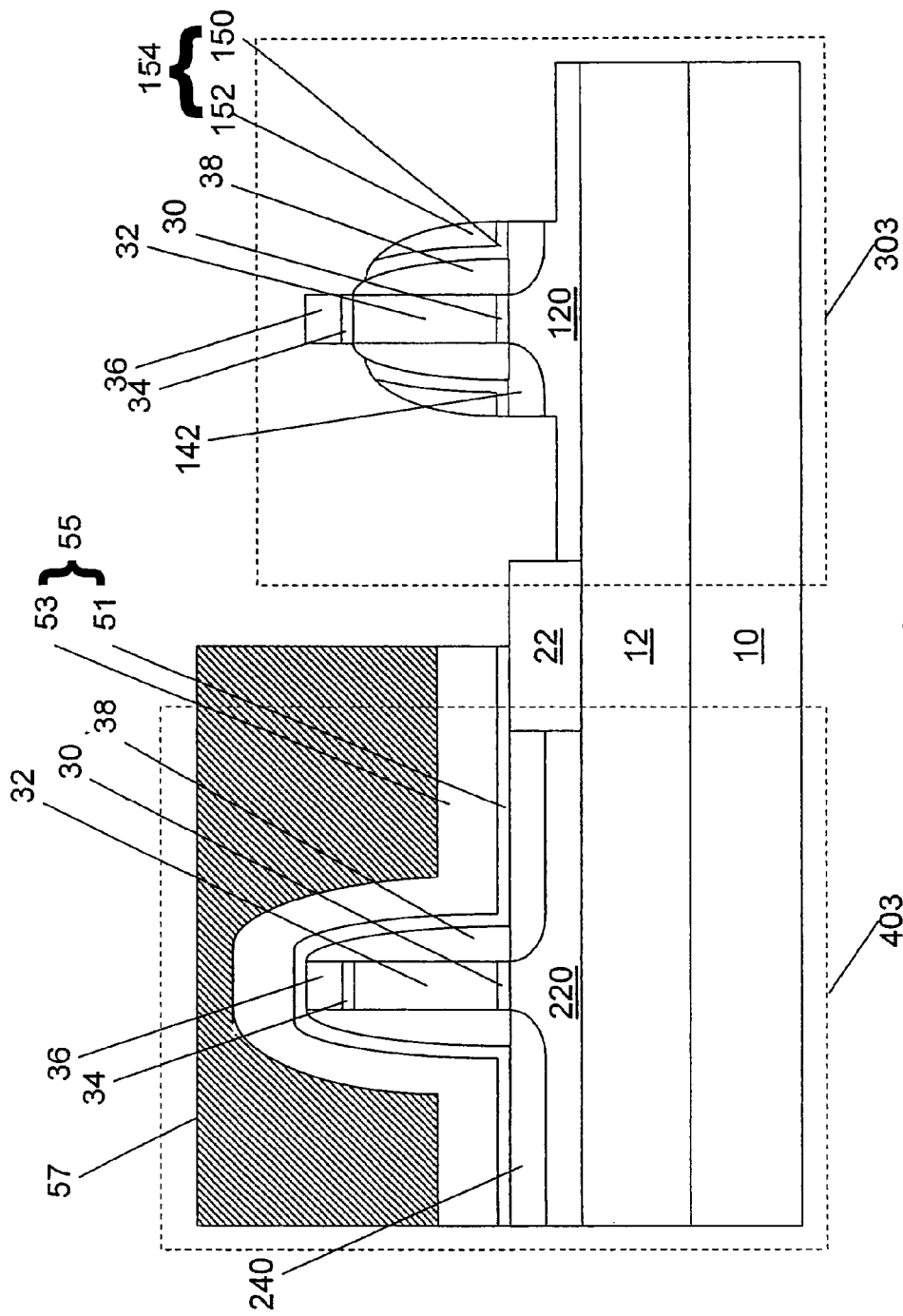

FIG. 3 shows a schematic vertical cross section of a PFET structure 302 and an NFET structure 402 after the formation of the first spacers 38 on the walls of the gate stacks, followed by a blanket deposition of a second spacer stack 55. In a preferred version of the first embodiment, the second spacer stack 55 comprises a stack of an oxide layer 51 and a nitride layer 53. However, use of one oxide layer, one nitride layer, and a stack comprising more than two dielectric layers for the second spacer stack 55 is herein contemplated also.

A first photoresist is then applied over the second spacer stack 55 and patterned to cover the portion of the second spacer stack 55 over the NFET area while exposing the portion of the second spacer stack 55 over the PFET area. A first reactive ion etch (RIE) is performed to form second PFET spacers 154 out of the second spacer stack 55. In a preferred version of the first embodiment, the second PFET spacers 154 comprise PFET spacer oxide layers 150 and PFET spacer nitride layers 152. The first reactive ion etch proceeds until at least the silicon surface of the PET structure 302 in FIG. 3 is exposed. Preferably, the first RIE continues further into the body 120 of a PFET structure 302 such that height of the exposed silicon surface in the source/drain region is lower than the height of the gate dielectric 30 as depicted in a PFET structure 303 in FIG. 4. While the first RIE removes portions of the regions with PFET extension implant 140, the remainder of the regions with PFET extension implant 140 under the gate stack is preserved on the silicon substrate. This is referred to as "intermediate PFET extensions" 142 hereafter. During the first RIE, an NFET structure 403 is covered with a first layer of photoresist 57 to prevent any etching of the material in the regions with NFET extension implant 240. The first RIE stops before all silicon material above the buried oxide layer 12 is consumed by the etching process in the exposed source/drain area.

The first layer of photoresist 57 is then stripped leaving the second spacer stack 55 over the NFET structure 403 in the NFET area. This is because typical resist material is not capable of withstanding the relatively high temperature during a selective epitaxy process for silicon germanium alloy deposition. After suitable surface preparation such as a wet clean, selective epitaxy of silicon germanium alloy is performed to grow embedded silicon germanium alloy 160' in the source and drain regions in the PFET area. The embedded silicon germanium alloy 160' is epitaxially aligned to the body of the PFET 120 so that the body of the PFET 120, the intermediate PFET extensions 142, and the embedded silicon germanium alloy 160' form a contiguous single crystalline structure within each area surrounded by STI 22.

Figure 5:
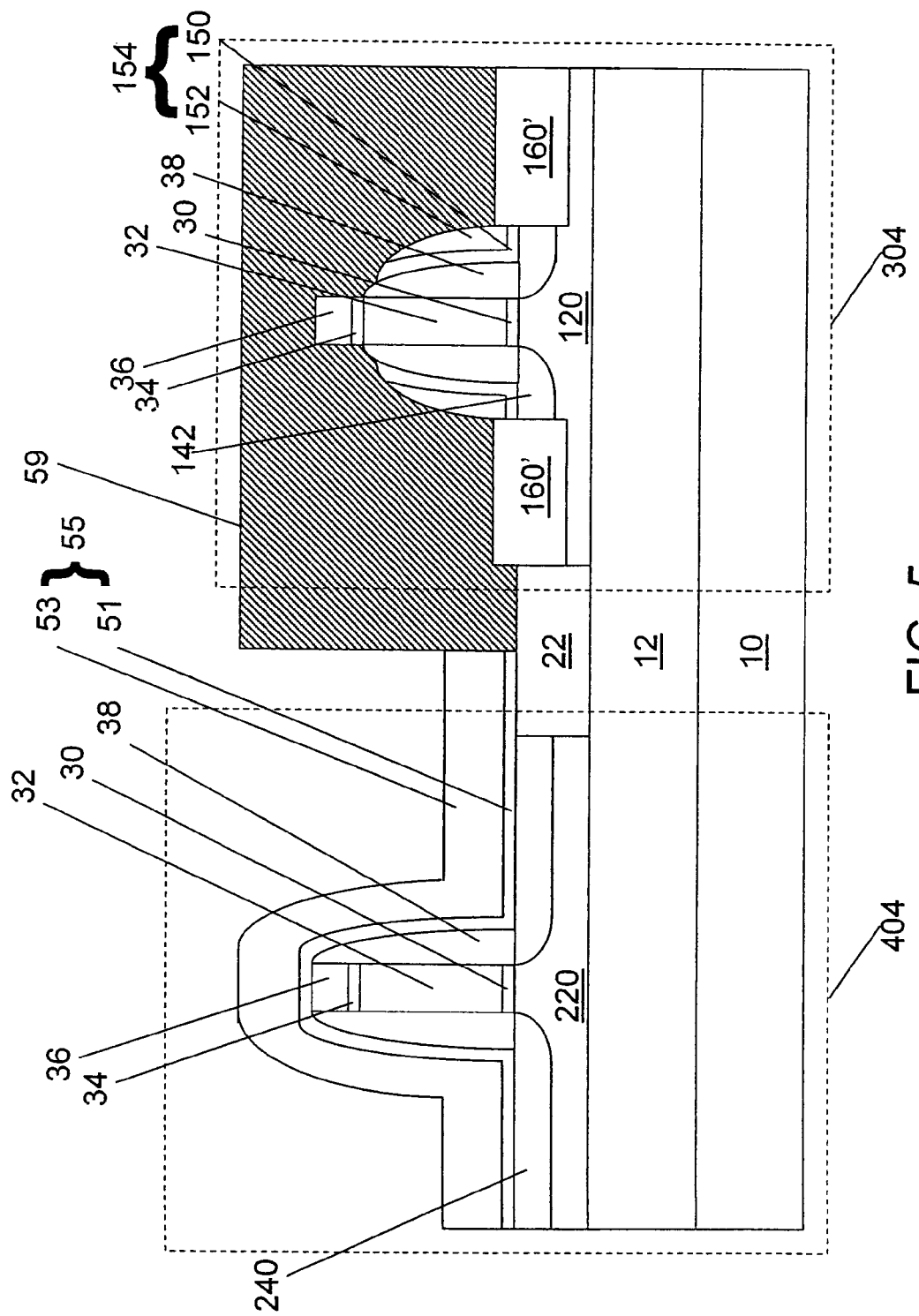
Figure 6:
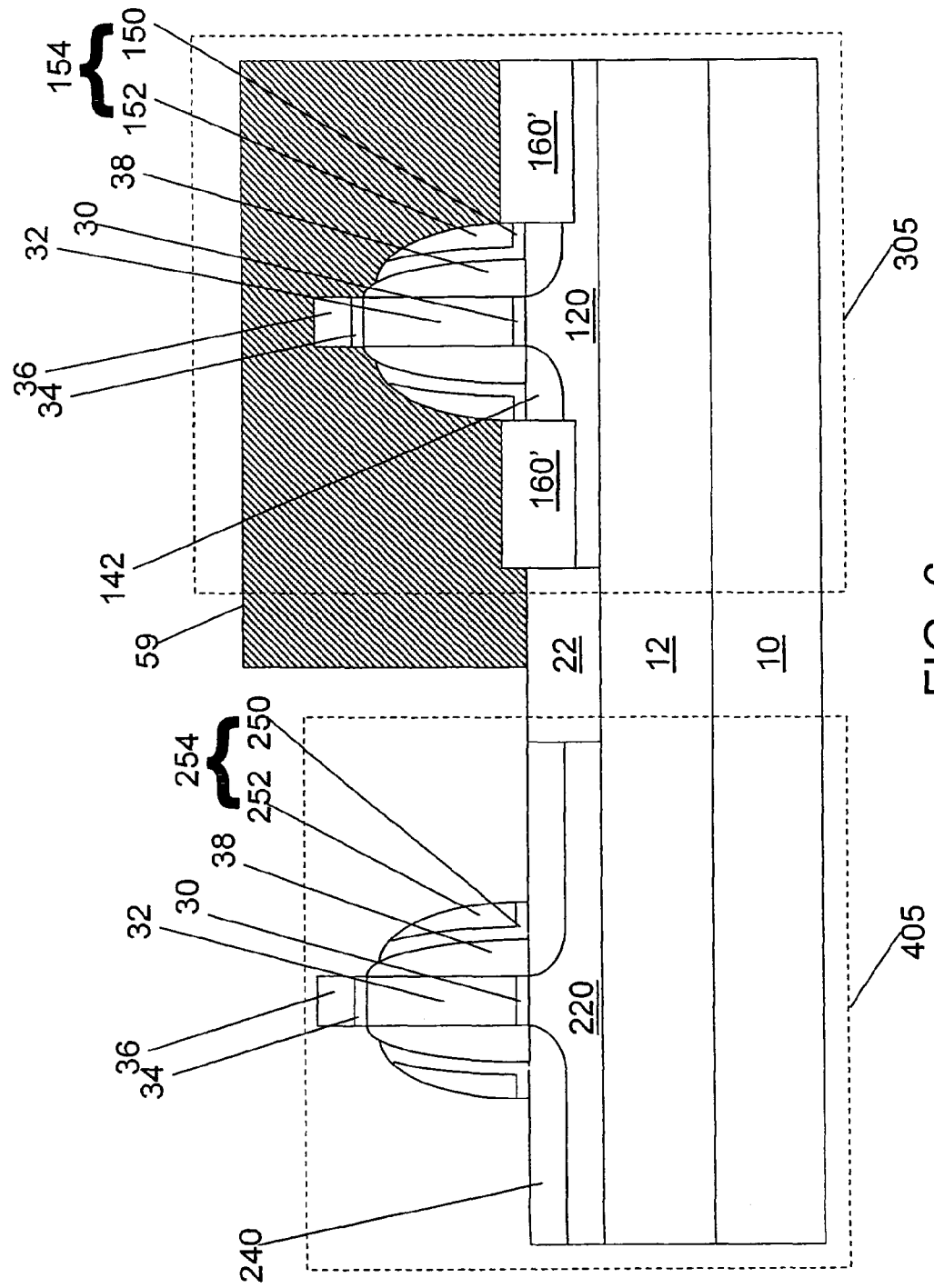

A second layer of photoresist 59 is then applied and lithographically patterned to cover the PFET area and expose the NFET area as shown in FIG. 5. At this point, a PFET structure 304 is covered by the patterned second photoresist 59 and an NFET structure 404 is covered by the second spacer stack 55. A second RIE is performed to form second NFET spacers 254 out of the second spacer stack 55. In a preferred version of the first embodiment, the second NFET spacers 254 comprise PFET spacer oxide layers 250 and PFET spacer nitride layers 252. FIG. 6 shows a PFET structure 305 and an NFET structure 405 after the completion of the second RIE.

Figure 7:
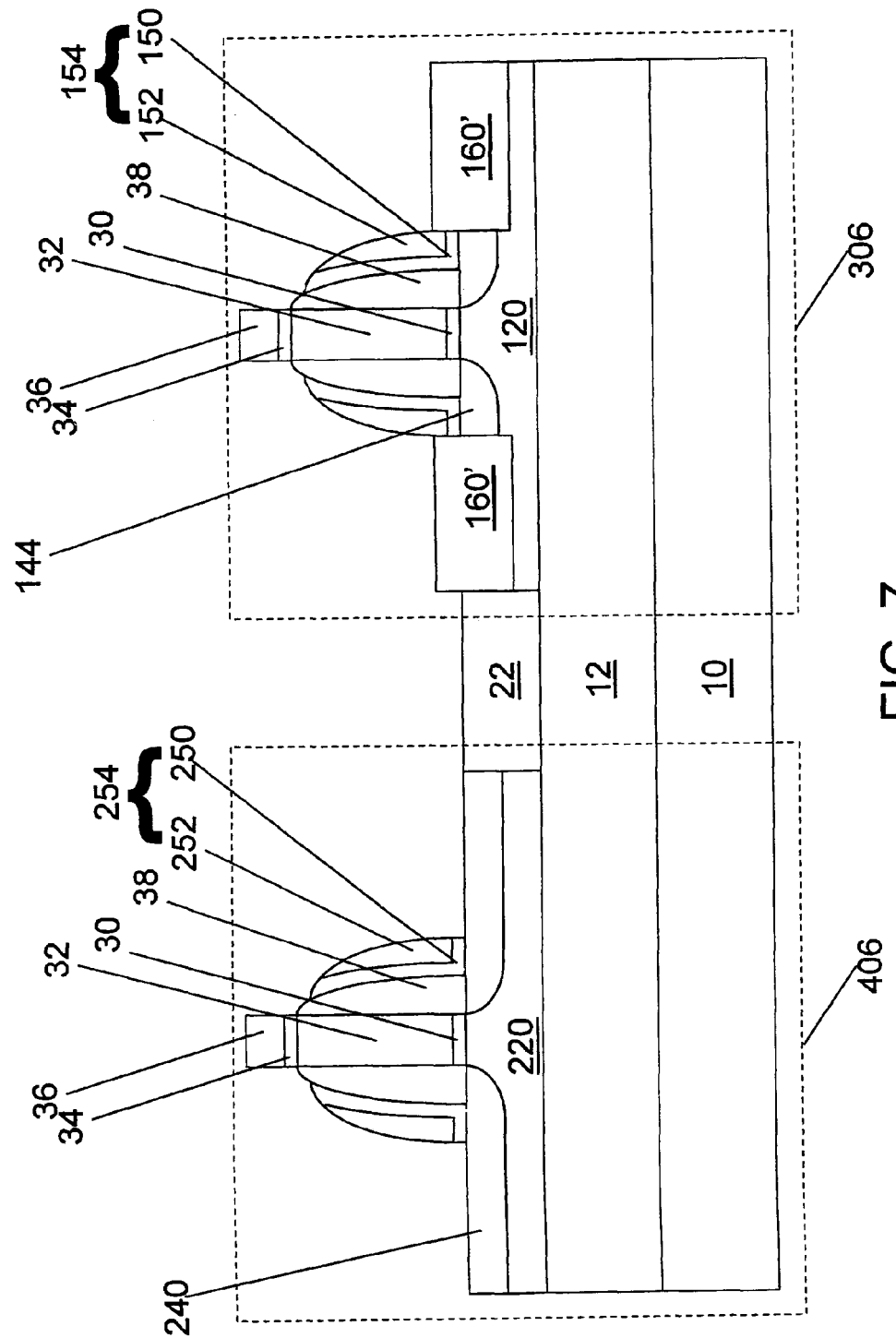
Figure 8:
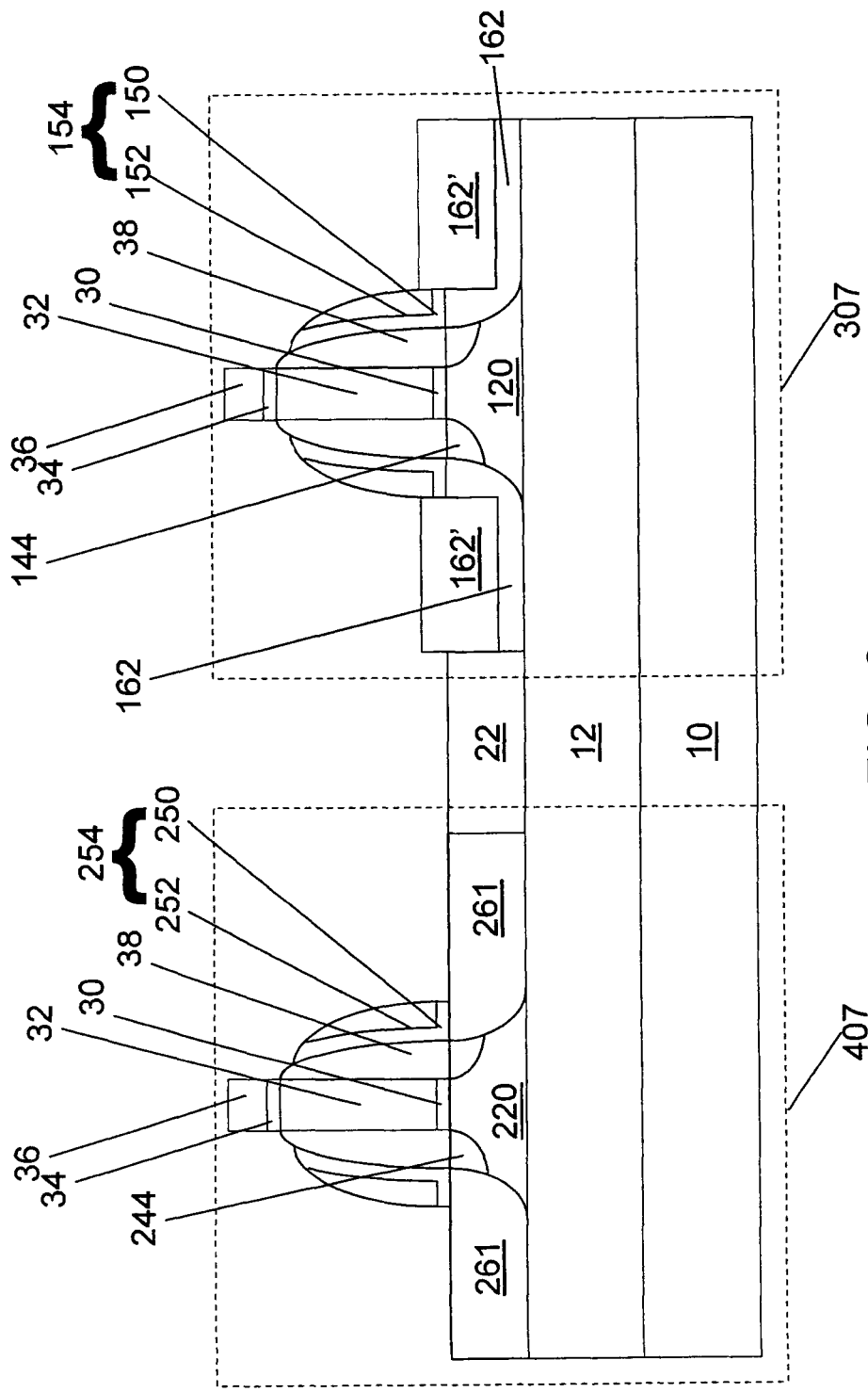

The second layer of photoresist 59 is then removed. FIG. 7 shows a PFET structure 306 and an NFET structure 406 after the removal of the photoresist 59.

The electrical doping of the source and drain regions for the PFET area and NFET area are done at this stage using a conventional lithographic method and an ion implantation method. If desired, activation of the electrical dopants by anneal may be performed immediately after the ion implantation steps or they may be postponed to a later stage in the process flow. Conventional electrical dopants known in the art include boron, phosphorus, arsenic, and antimony. A PFET structure 307 in FIG. 8 contains P-doped silicon 162 and P-doped silicon germanium alloy 162' in the source and the drain regions. The "PFET extension" 144 is the part of the intermediate PFET extensions 142 that did not receive extra dopants during the electrical doping of the source and drain regions. An NFET structure 407 in FIG. 8 contains "intermediate N-doped silicon" 261 in each of the source and the drain regions. The "NFET extension" 244 is the portion of regions with NFET extension implant 240 that did not receive extra dopants during the electrical doping of the source and drain regions. The body of the PFET 120, the PFET extension 144, the P-doped silicon 162, and the P-doped silicon germanium alloy 162' form a contiguous single crystalline structure within each area surrounded by STI 22. Likewise, the body of the NFET 220, the NFET extension 244, and the intermediate N-doped silicon 261 form a contiguous single crystalline structure within each area surrounded by STI 22.

While germanium is not an electrical dopant, amorphization implant using germanium as part of the electrical doping process for the sake of improving the doping of the source and drain regions is known in the art. However, the amount of germanium according to this method is typically limited to less than 1% of the material within the source/drain region in atomic concentration. Typically, carbon or germanium above 1% in atomic concentration is not considered to be part of conventional electrical doping of the source and drain regions. These criteria are base on the ability of these dopants to change the stress in any substantial way in the source and drain regions. During the electrical doping of the source and drain regions according to the first embodiment of the present invention, no significant stress is generated within the source and drain regions.

Figure 9:
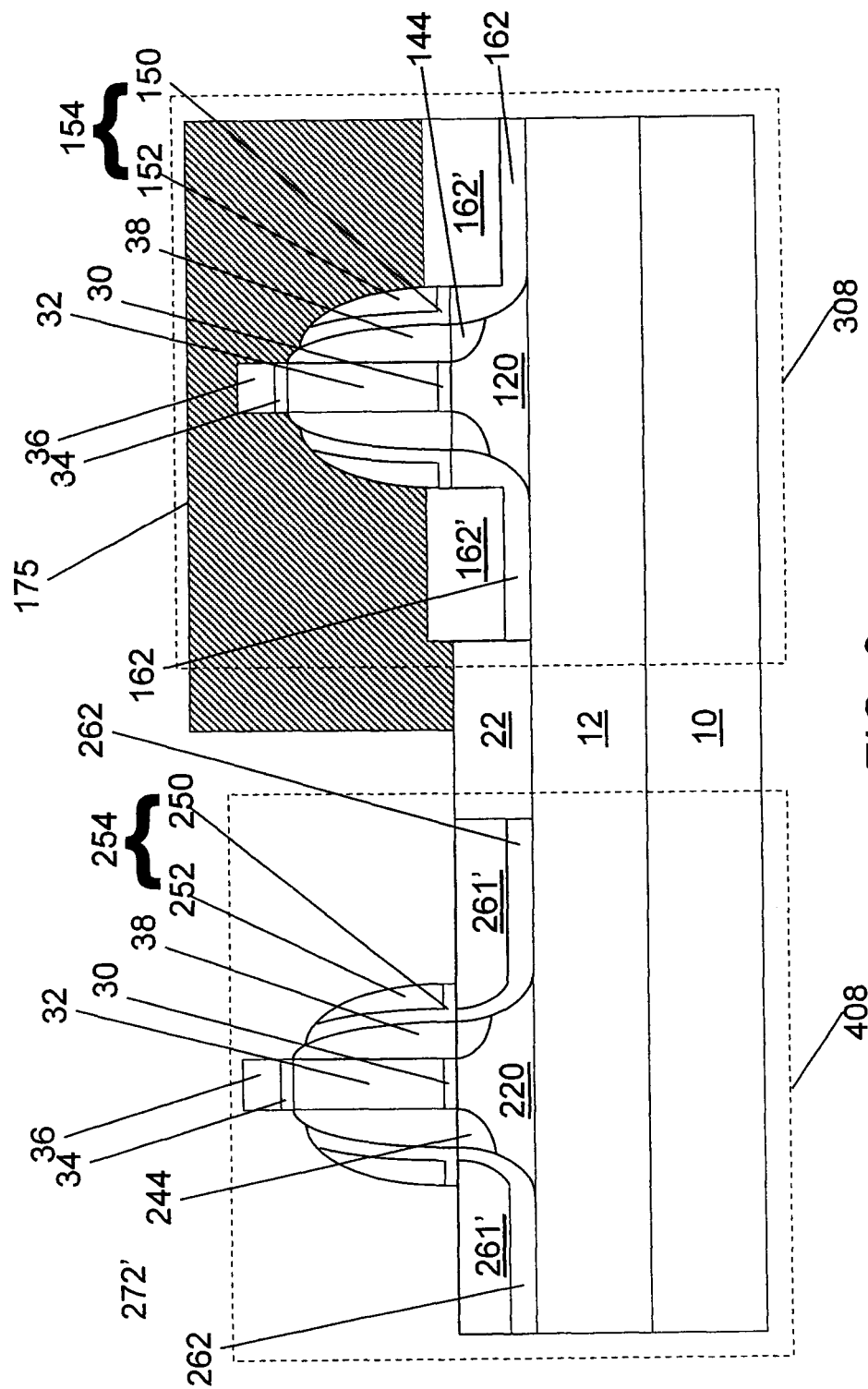

A third layer of photoresist 175 is then applied and lithographically patterned to cover the PFET area as shown in FIG. 9. Carbon is implanted into the NFET area to dope the source and drain regions of an NFET structure 408 as shown in FIG. 9. A PFET structure 308 is protected from the carbon implantation by the third layer of photoresist 175. The implantation of carbon into the NFET area changes each of the intermediate N-doped silicon 261 into two parts: N-doped silicon carbon alloy 261' and N-doped silicon 262. The photoresist 275 is thereafter removed.

The implanted carbon immediately after implantation does not necessarily occupy substitutional sites in the crystal structure. As a consequence of the implantation, the N-doped silicon 262 has crystalline structure with few defects at this point, the N-doped silicon carbon alloy 261' is amorphous. By annealing the substrate at a high temperature at this point, an N-doped single crystalline silicon carbon alloy, an "N-doped Si:C alloy" 262', is epitaxially regrown within the N-doped silicon carbon alloy 261' with the N-doped silicon 262 as the epitaxial template. This process is called "solid phase epitaxy" (SPE) and the methods of performing a solid phase epitaxy are known in the art. In essence, the silicon and carbon atoms in the N-doped silicon carbon alloy 261' align themselves epitaxially to the underlying lattice structure beginning from the interface between the N-doped silicon 262 and the original N-doped silicon carbon alloy 261'. During the SPE, after one atomic layer of Si:C is epitaxially aligned to the underlying single crystalline lattice, the next atomic layer of Si:C is formed. This process continues layer by layer until the entire material within the original N-doped silicon carbon alloy 261' is incorporated into the single crystalline structure and form an Si:C alloy. Since the original N-doped silicon carbon alloy 261' contains N-type dopants, the N-type dopants are also epitaxially incorporated into the Si:C structure and forms an N-doped Si:C alloy 262'.

Any of the processes known for SPE may be utilized to practice the present invention. Preferably, the anneal process is a laser anneal with a peak temperature between 700° C. and 1428° C. Once the N-doped Si:C alloy 262' are formed in the source and drain regions in the NFET area, the body of the NFET 220, the NFET extension 244, the N-doped Si:C alloy 262' and the N-doped silicon 262 form a contiguous single crystalline structure within each area surrounded by STI 22.

Thereafter, selective silicon deposition is performed on the PFET area and the NFET area. During the selective silicon deposition, reactants containing the source material for silicon such as $SiH_4$, $Si_2H_6$, $SiHCl_3$, $SiH_2Cl_2$, or $SiH_3Cl$ are introduced into a process chamber containing a semiconductor substrate along with an etchant such as HCl or $NH_4Cl$ and a carrier gas such as $H_2$. Sometimes, under suitable conditions, reactants that contain high atomic ratio of chlorine to hydrogen may decompose within the process chamber to provide enough etchants by themselves. The semiconductor substrate contains two types of surfaces: semiconductor surfaces and dielectric surfaces. The surfaces of silicon or silicon alloys are semiconductor surfaces. The surfaces of dielectric films such as silicon oxide, silicon nitride are dielectric surfaces. Due to the presence of etchants among the reactants, the deposition process competes with an etch process during a selective silicon deposition. Deposition of new silicon material does not occur on the dielectric surfaces since any nucleation of silicon atoms is immediately etched by the etchants. Therefore, the deposition of new silicon material occurs only on silicon surfaces or silicon alloy surfaces. In a typical transistor structure, each region of silicon alloy material or silicon material, whether it be a source region or a drain region, is surrounded by dielectric materials such as STI, and therefore, a new layer containing silicon and grown epitaxially by selective silicon deposition, to be called a "silicon layer" hereafter, is also surrounded by dielectric materials.

Depending on the mobility of the silicon atoms and the impurity levels in the ambient gas stream in the process chamber, the new silicon layer may itself be epitaxially aligned to the underlying silicon or silicon alloy or it may form polysilicon, microcrystalline silicon, or even amorphous silicon. In a preferred version of the first embodiment of the present invention, the selective silicon deposition process is a selective silicon epitaxy, wherein the new silicon layer is epitaxially aligned to the underlying silicon or silicon alloy. In this process, the substrate is typically at a high enough temperature to provide sufficient surface mobility to the silicon atoms that originate from the silicon precursors in the reactant gas stream and adsorb on the growth surface. Also, the impurity level in the gas stream is kept low to prevent impurities from landing on the growth surface and cause defects in the crystalline structure.

The epitaxial alignment of the silicon layer with the underlying silicon alloys is advantageous to the performance of the transistor because any grain boundary or crystalline defect serves as a scattering center and reduces the carrier mobility, which is the case with polysilicon, microcrystalline silicon, amorphous silicon, and a silicon material that loses epitaxial alignment with the underlying single crystalline silicon. If some of the silicon material in the silicon layer is not reacted during the formation of contacts, the remaining silicon material contains many of the crystalline defects and the scattering of electrons or holes at the defects decreases the conductivity of the source or drain region. This problem may be avoided only if all of the silicon material in the silicon layer is consumed during the formation of contacts by reacting with the deposited metal for metal silicide formation. Epitaxially aligned silicon in the silicon layer does not cause any negative impact on the contact resistance even if not all of the silicon material in the silicon layer is reacted with metal. Due to this advantages provided by epitaxial alignment of the silicon layer to the underlying crystalline structure, all the embodiments of the present invention, including the first embodiment, are described with a selective silicon epitaxy process for the selective silicon deposition.

Figure 10:
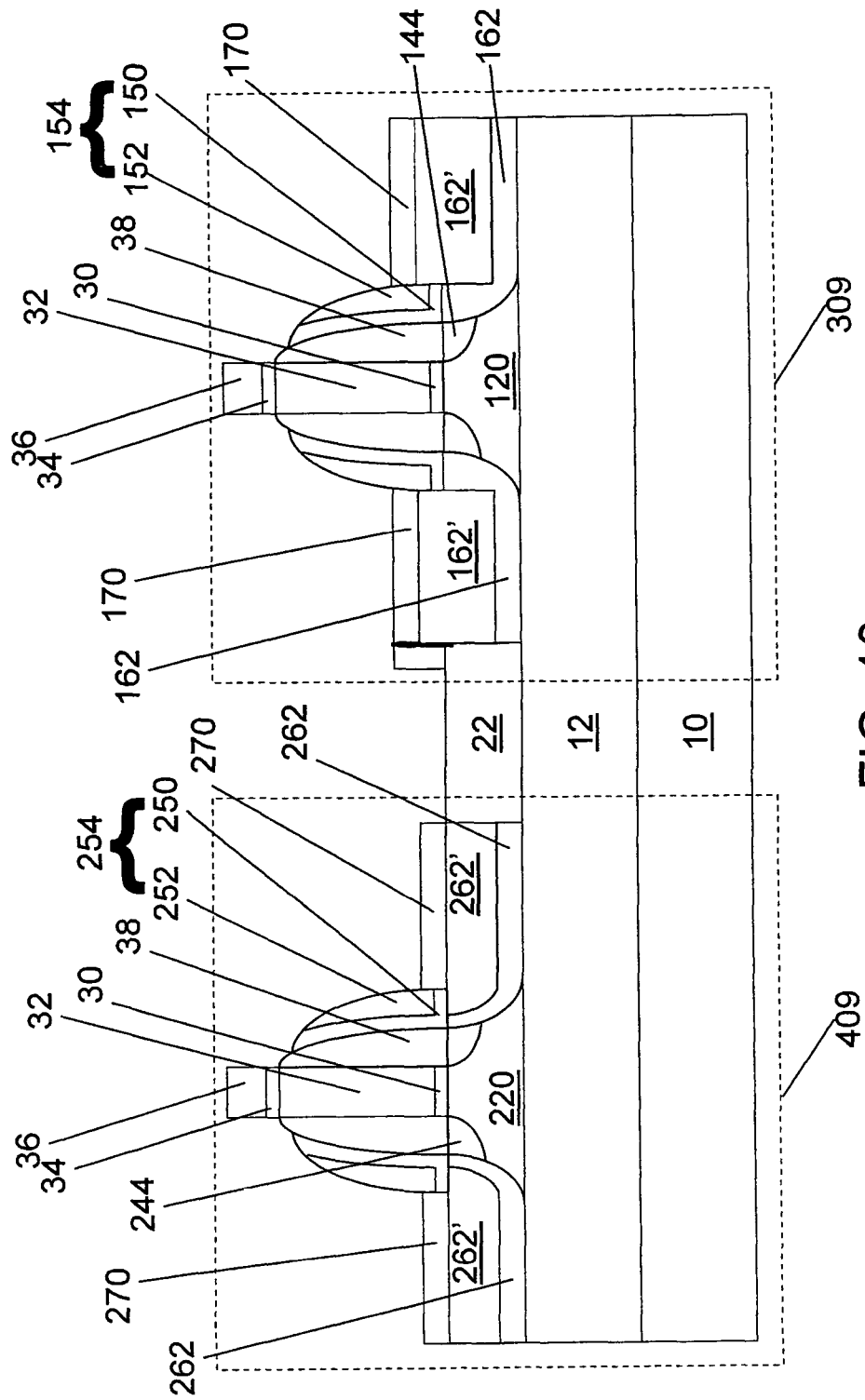

FIG. 10 shows a PFET structure 309 and an NFET structure 409 after a selective silicon epitaxy process. The PFET structure 309 now contains silicon layer 170 over the P-doped silicon germanium alloy 162', which in turn is disposed on the P-doped silicon 162. The NFET structure 409 contains silicon layer 270 over the N-doped Si:C alloy 262', which in turn is disposed on the N-doped silicon 262. The silicon material in the newly formed silicon layer is essentially free of carbon or germanium since the reactants in the silicon selective epitaxy process provide only silicon atoms onto the existing silicon alloy surfaces. Also, compared to the rate of surface diffusion which must occur for a successful epitaxy process, the rate of bulk diffusion for germanium or carbon at the temperature of the silicon selective epitaxy is much lower and therefore, only a small amount of carbon or germanium, often a trace amount, diffuses into the newly formed silicon layer through the interface between the silicon alloy layers and the new silicon layer. Any other material in the silicon layer that is newly formed by selective silicon epitaxy is only in minute quantities and therefore, the silicon layer can be considered essentially free of carbon or germanium.

At this point, the body of the PFET 120, the PFET extension 144, the P-doped silicon 162, the P-doped silicon germanium alloy 162', and the silicon layer 170 over the P-doped silicon germanium alloy 162' form a contiguous single crystalline structure within each area surrounded by STI 22. Likewise, the body of the NFET 220, the NFET extension 244, the N-doped silicon 262, the N-doped Si:C alloy 262', and the silicon layer 270 over N-doped Si:C alloy 262' form a contiguous single crystalline structure within each area surrounded by STI 22.

Figure 11:
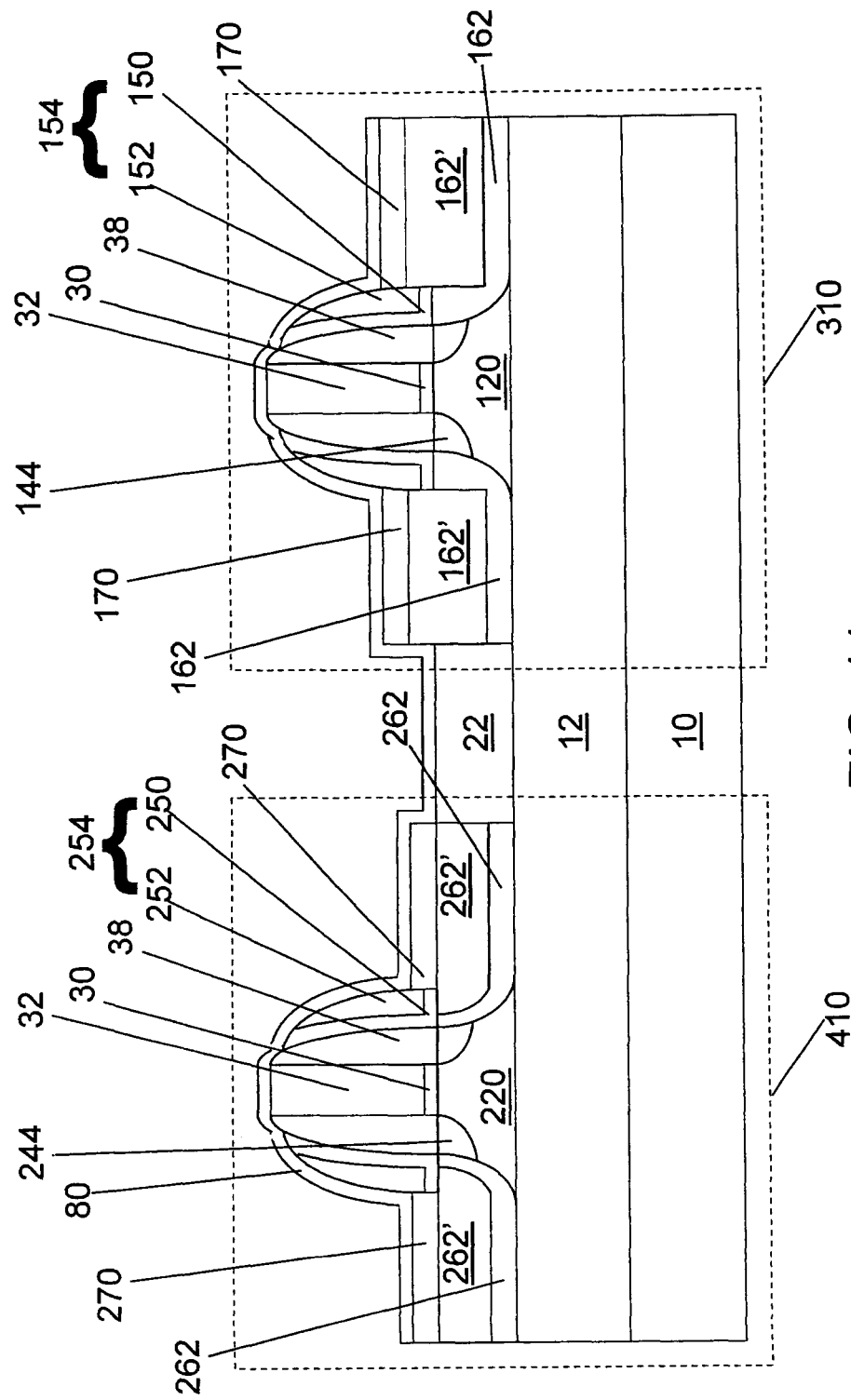

Thereafter, the gate cap oxide 34 and the gate nitride layer 36 are removed. Metal 80 is then deposited over the silicon substrate in an ultra high vacuum chamber by physical vapor deposition (PVD). FIG. 11 shows a PFET structure 310 and an NFET structure 410 after such metal deposition. The deposited metal is reacted with the silicon in the underlying silicon layer in the source and drain regions and also with the polysilicon within the gate stack. According to the first embodiment of the present invention, only a portion of the silicon layer is consumed to form a metal silicide while the remaining portion of the silicon layer is not consumed during the formation of said contact material. Since the silicon layer deposited through selective silicon deposition, preferably selective silicon epitaxy, is essentially free of carbon or germanium, the contact material is not a mixture or alloy of metal silicide and other material, such as metal germanide, metal carbide, or even carbon. The contact material is an unalloyed metal silicide in both a PFET structure 311 and an NFET structure 411 in FIG. 12.

In the final structure of the transistors according to the first embodiment of the present invention, the body of the PFET 120, the PFET extension 144, the P-doped silicon 162, the P-doped silicon germanium alloy 162', and the unreacted silicon layer 190 over the P-doped silicon germanium alloy 162' form a contiguous single crystalline structure within each area surrounded by STI 22. Likewise, the body of the NFET 220, the NFET extension 244, the N-doped silicon 262, the N-doped Si:C alloy 262', and the unreacted silicon layer 290 over the N-doped Si:C alloy 262' form a contiguous single crystalline structure within each area surrounded by STI 22.

Figure 12:
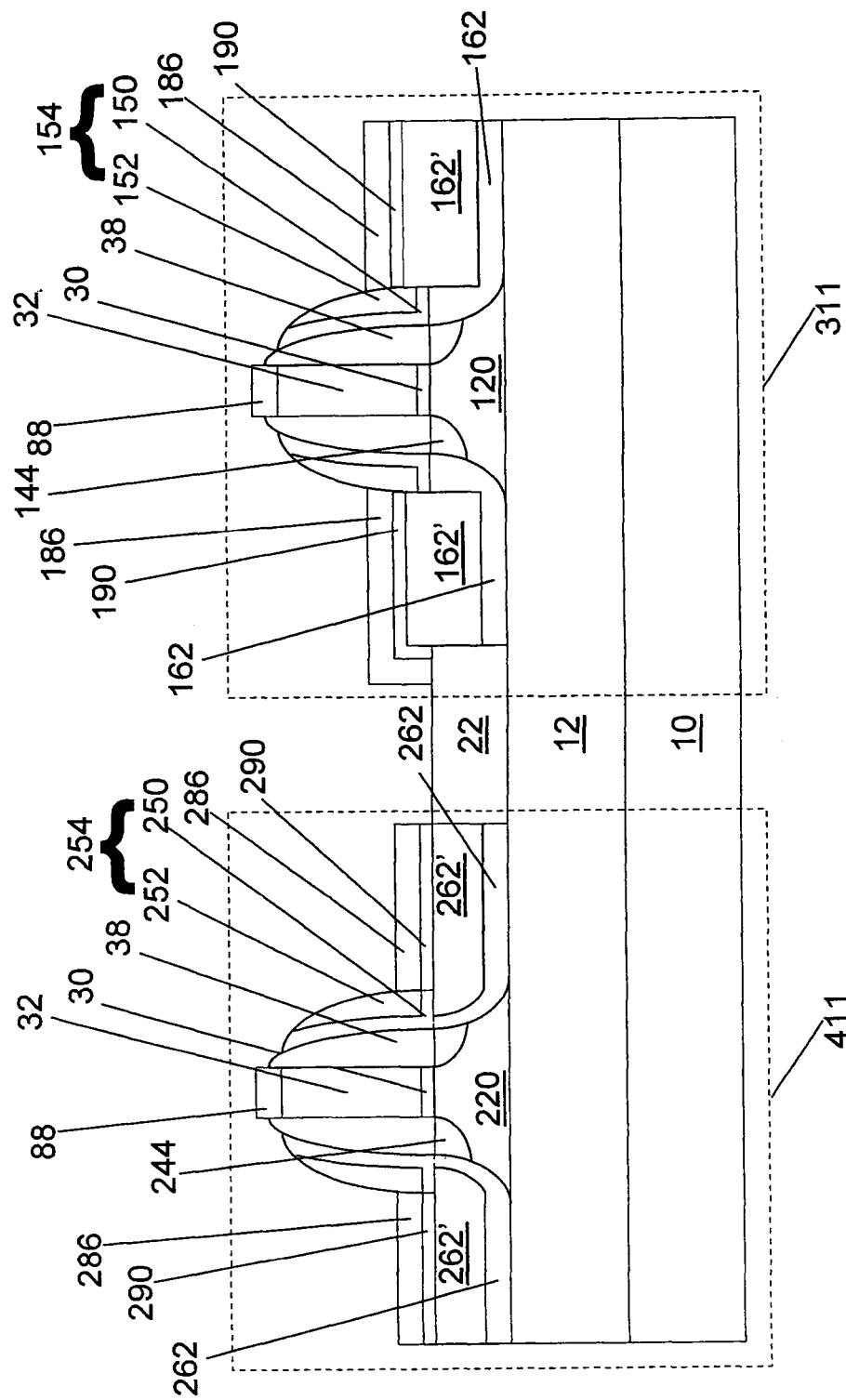
FIG. 12 is a vertical cross-sectional view of a pair of a completed NFET and a completed PFET according to the first embodiment of the present invention.

While there is no electrical dopants in the unreacted silicon layer 190 over the P-doped silicon germanium alloy 162' or in the unreacted silicon layer 290 over the N-doped Si:C alloy 262' in FIG. 12 according to the present invention, one of ordinary skill in the art are cognizant of the fact that the diffusion of electrical dopants over a short distance is readily achievable through a moderate anneal. Therefore, the diffusing electrical dopants from the underlying N-doped Si:C layers or P-doped silicon germanium alloy layers through anneal to reduce the contact resistance of the source and drain regions is an obvious application of this invention. On the other hand, N-type and P-type dopants can be implanted into the top Si layer on top of Si:C and SiGe, respectively, before silicidation.

The fact that the first embodiment of the present invention provides unalloyed silicide over both the silicon germanium alloy and silicon carbon alloy in turn enables low contact resistance for devices with embedded silicon alloys in the source and drain regions. In addition, the height of the source and the drain, as defined by the interface between the contact material and the semiconductor material, is significantly higher than an equivalent structure that does not employ selective silicon deposition during the process flow. The increased height of the source and drain increases the stress on the channels of the transistors with embedded silicon alloys.

While the first embodiment of the present invention is described with lithographic steps at each stage of the process flow, those skilled in the art would recognize that some simplification of the process flow is possible by utilizing common litho masks for consecutive processes when permitted. Also, substitution of noncritical elements of the present invention with known material with similar properties would be similarly recognized.

Figure 13:
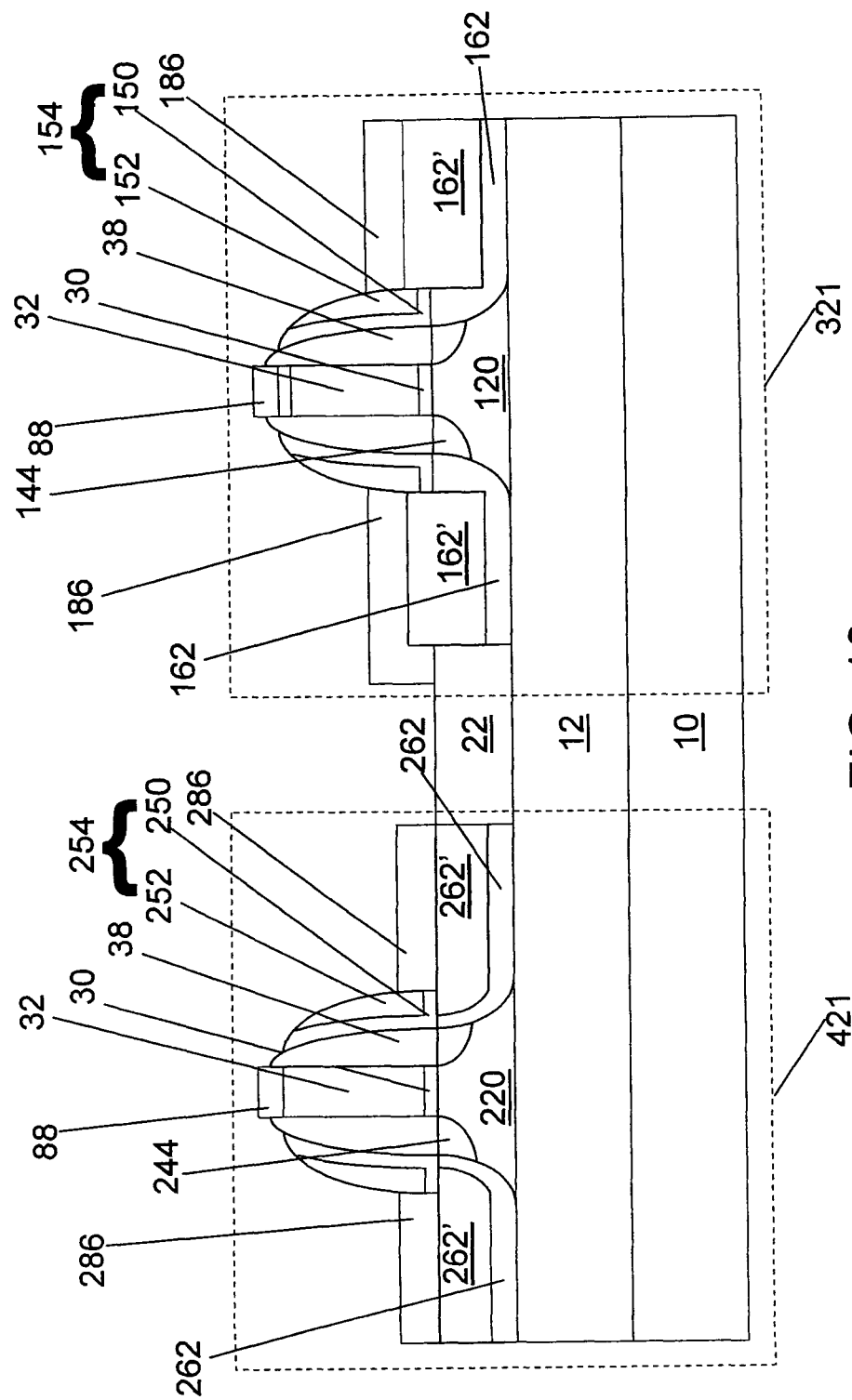
FIG. 13 is a vertical cross-sectional view of a pair of a completed NFET and a completed PFET according to the second embodiment of the present invention.

According to the second embodiment of the present invention, all process steps and structures are identical as in the first embodiment of the present invention until the deposition of metal 80 for the purpose of contact formation is completed as in FIG. 11. During the reaction of the metal 80 with the underlying silicon layer 170 over silicon germanium alloy 162' and with the underlying silicon layer 270 over the N-doped Si:C alloy 262', the metal 80 is reacted with all the silicon material that was deposited during the selective silicon deposition. The resulting structure for the PFET 321 and the resulting structure for the NFET 421 are shown in FIG. 13.

Each one of the source and drain regions for a PFET contains a stack of an unalloyed metal silicide 186 and an electrically doped epitaxial silicon germanium alloy layer 162'. Each one of the source and drain regions for an NFET contains a stack of an unalloyed metal silicide 286 and an N-doped Si:C alloy 262'. Allowing the reaction of the metal to consume a portion of the underlying doped silicon germanium alloy 162' or a portion of the underlying N-doped Si:C alloy 262' is also contemplated herein.

The third through the twelfth embodiments of the present invention use the elements of the first and second embodiments of the present invention with some alteration. Description of these embodiments is done first by comparing the differences across the various embodiments of the present invention and then specific features and ramifications of each embodiment are described.

The twelve embodiments are classified into two groups of embodiments. A first group of embodiments include the first through sixth embodiments. A second group of embodiments include the seventh through twelfth embodiments. Within the first group of embodiments, the formation of the embedded silicon carbon alloy in the source and drain regions of the NFET area precedes the growth by selective deposition of a silicon material of a silicon layer in the PFET area and the NFET area. Within the second group of embodiments, the growth by selective deposition of a silicon material of a silicon layer in the PFET area and the NFET area precedes the formation of the embedded silicon carbon alloy in the source and drain regions of the NFET area.

In all of the twelve embodiments, formation of an embedded silicon germanium alloy, a source and drain implant for electrical doping, formation of an embedded silicon carbon alloy, and a selective silicon deposition, and formation of contact material are included. The order and details of processing methods and resulting structures are different depending on which embodiment is pursued. While the formation of Si:C alloy is preceded by the formation of SiGe alloy most of the time, third through sixth embodiments allow a reversal of process sequences between the two processes. A summary of the differences in the order of the process flow among the various embodiments is presented in Table 1.

TABLE 1

| Order of the process flow for various embodiments according to the present invention | | | | |
|---|---|---|---|---|
| embodiments | First process | Second process | Third process | Fourth Process |
| first and second embodiments | embedded SiGe alloy formation | electrical doping on source/drain | embedded Si:C alloy formation | selective silicon epitaxy |
| third and fourth embodiments | embedded SiGe or Si:C formation | embedded Si:C or SiGe formation | electrical doping on source/drain | selective silicon epitaxy |
| fifth and sixth embodiments | embedded SiGe or Si:C formation | embedded Si:C or SiGe formation | selective silicon epitaxy | electrical doping on source/drain |
| seventh and eighth embodiments | embedded SiGe alloy formation | selective silicon epitaxy | electrical doping on source/drain | embedded Si:C alloy formation |
| ninth and tenth embodiments | embedded SiGe alloy formation | selective silicon epitaxy | embedded Si:C alloy formation | electrical doping on source/drain |
| eleventh and twelfth embodiments | embedded SiGe alloy formation | electrical doping on source/drain | selective silicon epitaxy | embedded Si:C alloy formation |

Each pair of two embodiments sharing the same order of in the process flow in Table 1 contains one embodiment (odd numbered embodiment) wherein the reaction of metal 80 as in FIG. 11 is allowed to consume only a part of the silicon layer deposited during the selective silicon epitaxy and the other embodiment (even numbered embodiment) wherein the reaction of metal 80 as in FIG. 11 is allowed to consume the entirety of the silicon layer deposited during the selective silicon epitaxy. This results in differences in the final structure of the PFETs and NFETs.

The combination of the order in the process flow and the degree of reaction of metal 80 with the underlying layers results in the differences in the composition and doping of the various parts of the source and drain regions in the structure. These differences in source and drain regions of a PFET with embedded silicon germanium alloy according to the various embodiments of the present invention are tabulated in Table 2. N/A stands for "Not Applicable" and refers to a state where the relevant object does not exist.

TABLE 2

Composition and doping of a stack comprising a source/drain region in a PFET.

| embodiment | presence and state of unreacted portion of silicon layer | state of electrical doping on unreacted portion of silicon layer | Composition of contact material over embedded SiGe alloy | electrical doping material in the contact material |
|---|---|---|---|---|
| first embodiment | Yes, silicon | none | unalloyed metal silicide | none |
| second embodiment | No, N/A | N/A | unalloyed metal silicide | none |
| third embodiment | Yes, silicon | none | unalloyed metal silicide | none |
| fourth embodiment | No, N/A | N/A | unalloyed metal silicide | none |
| fifth embodiment | Yes, silicon | P-doped | unalloyed metal silicide | P-doping |
| sixth embodiment | No, N/A | N/A | unalloyed metal silicide | P-doping |
| seventh embodiment | Yes, silicon | P-doped | unalloyed metal silicide | P-doping |
| eighth embodiment | No, N/A | N/A | unalloyed metal silicide | P-doping |
| ninth embodiment | Yes, silicon | P-doped | unalloyed metal silicide | P-doping |
| tenth embodiment | No, N/A | N/A | unalloyed metal silicide | P-doping |
| eleventh embodiment | Yes, silicon | none | unalloyed metal silicide | none |
| twelfth embodiment | No, N/A | N/A | unalloyed metal silicide | none |

Likewise, differences in the source and drain regions of an NFET with embedded silicon carbon alloy according to the various embodiments of the present invention are tabulated in Table 3. As in the first and second embodiments, even though the state of electrical doping on unreacted portion of silicon layer may initially contain no electrical dopants, the diffusion of electrical dopants over a short distance is readily achievable through a moderate anneal. Therefore, the diffusing electrical dopants from the underlying N-doped Si:C layers or P-doped silicon germanium alloy layers through anneal to reduce the contact resistance of the source and drain regions is an obvious application of this invention.

TABLE 3

Composition and doping of a stack comprising a source/drain region in an NFET.

| embodiment | presence and state of unreacted portion of silicon layer | state of electrical doping on unreacted portion of silicon layer | Composition of contact material over embedded SiG alloy | electrical doping material in the contact material |
|---|---|---|---|---|
| first embodiment | Yes, silicon | none | unalloyed metal silicide | none |
| second embodiment | No, N/A | N/A | unalloyed metal silicide | none |
| third embodiment | Yes, silicon | none | unalloyed metal silicide | none |
| fourth embodiment | No, N/A | N/A | unalloyed metal silicide | none |
| fifth embodiment | Yes, silicon | N-doped | unalloyed metal silicide | N-doping |
| sixth embodiment | No, N/A | N/A | unalloyed metal silicide | N-doping |
| seventh embodiment | Yes, Si:C | N-doped | metal silicide, carbon, metal carbide | N-doping |
| eighth embodiment | No, N/A | N/A | metal silicide, metal carbide, carbon | N-doping |
| ninth embodiment | Yes, Si:C | N-doped | metal silicide, carbon, metal carbide | N-doping |
| tenth embodiment | No, N/A | N/A | metal silicide, metal carbide, carbon | N-doping |
| eleventh embodiment | Yes, Si:C | none | metal silicide, metal carbide, carbon | none |
| twelfth embodiment | Yes, silicon | N/A | metal silicide, metal carbide, carbon | none |

Noteworthy differences in the structures according to the third through twelfth embodiments of the present invention with respect to the first and second embodiments are described below following essential differences in the process flow. Like structures in various embodiments are labeled with the same reference number in the figures to imply that the structure and function are identical to those described in the prior embodiments. Elements with identical structural and functional equivalency are labeled with the same name in various embodiments of the present invention even when the numbers are different. Often, the differences in numbers suggest the presence of different intermediate structures prior to the step in which the element with a different number is introduced.

Figure 14:
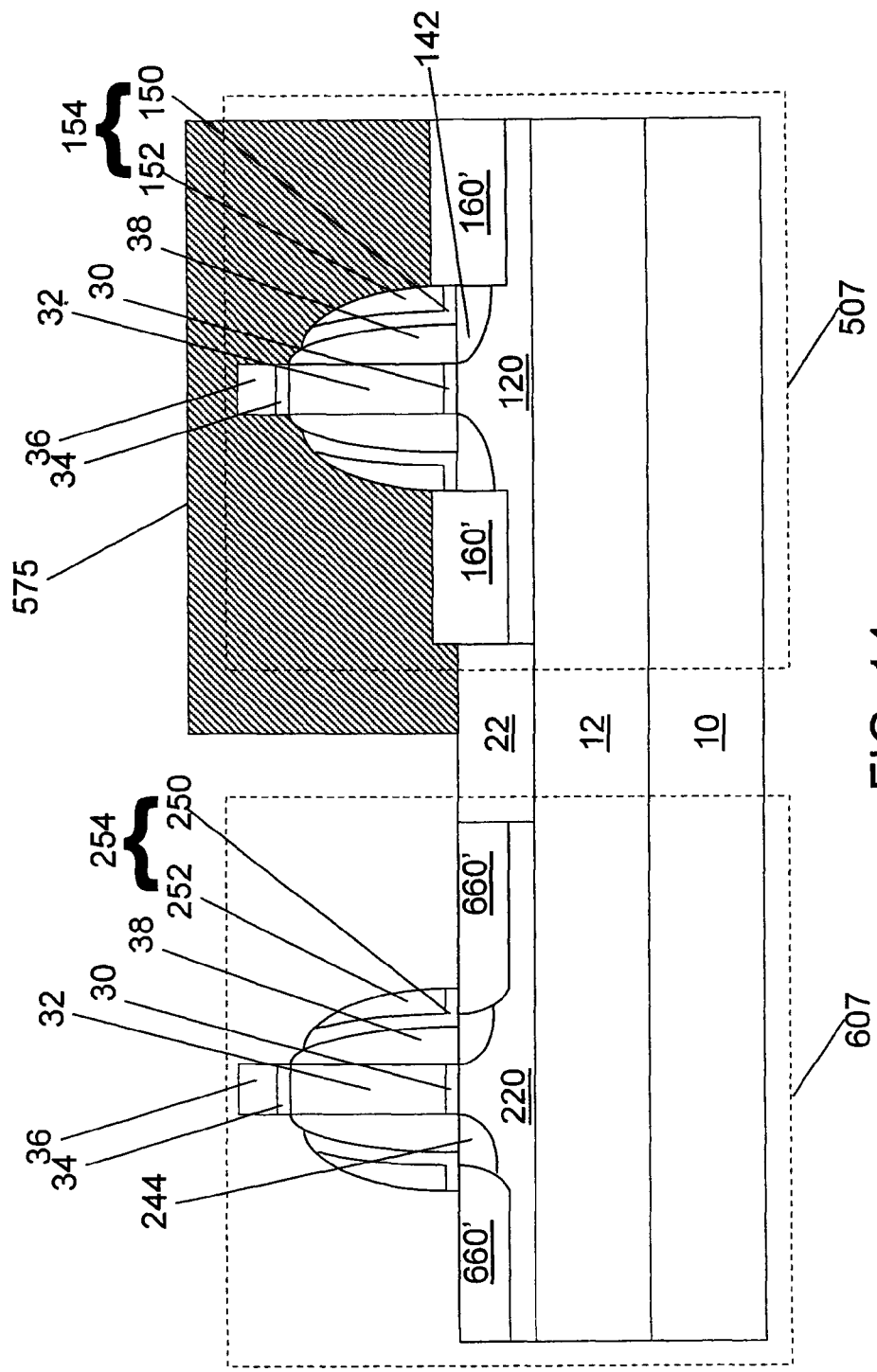
FIGS. 14-16 are sequential vertical cross-sectional views of a pair of an NFET and a PFET according to the third and fourth embodiments of the present invention.

According to the third and fourth embodiments of the present invention, the embedded silicon germanium alloy 160' in a PFET structure 507 and the embedded Si:C alloy 660' in an NFET structure 607 are formed prior to the electrical doping of the source and drain regions as shown in FIG. 14. According to a preferred version of the third and fourth embodiment of the present invention, the embedded silicon germanium alloy 160' are formed in the same way as in the first and second embodiments up to the processing steps corresponding to FIG. 7.

Figure 15:
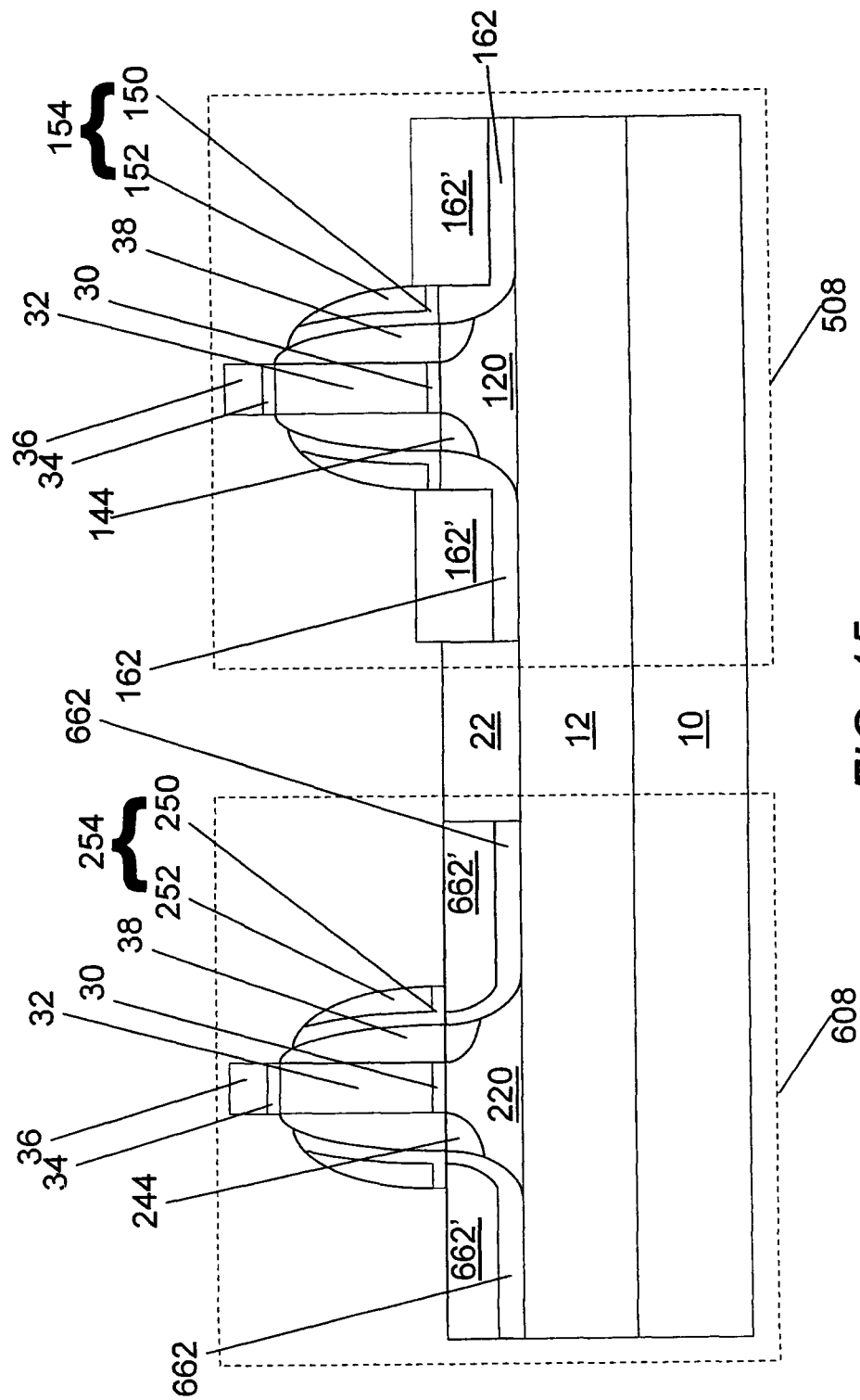
Figure 16:
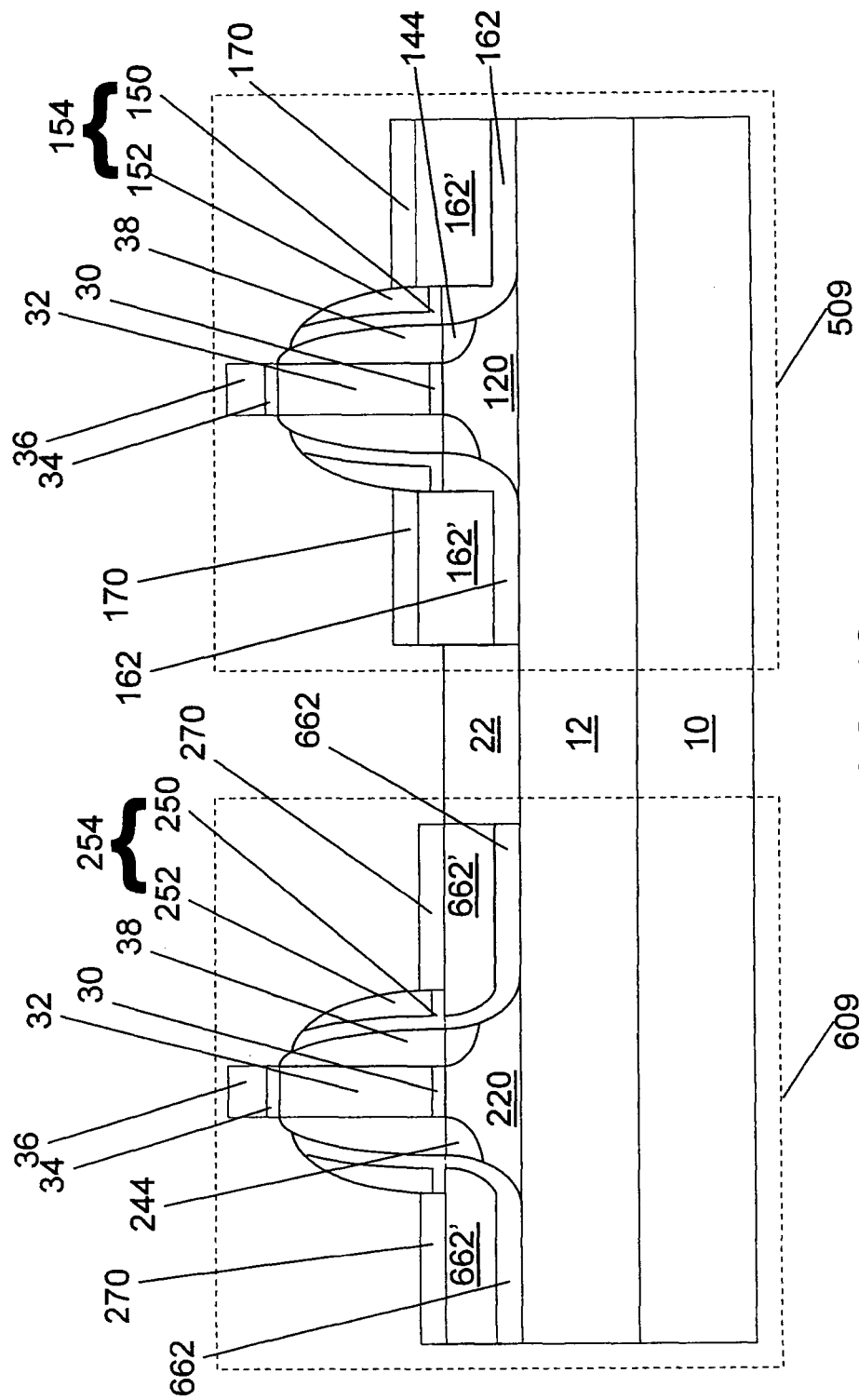

Then, as in FIG. 14, a PFET structure 507 is covered with a fourth photoresist 575 and carbon is implanted into the NFET structure 607. The fourth photoresist 575 is removed and the silicon substrate is subjected to an anneal process to form Si:C within the region of the source and the drain with carbon. Identical processes as in the first and second embodiments are employed to form undoped embedded Si:C alloy 660'. However, undoped embedded Si:C alloy 660' is not present at any stage of processing according to the first and second embodiments of the present invention. As processing continues according to the third and fourth embodiments, the electrical doping of the source and drain regions are performed thereby producing N-doped Si:C alloy 662' and N-doped silicon 662 in an NFET structure 608 shown in FIG. 15. These structures are identical to the N-doped Si:C alloy 262' and N-doped silicon 262 in FIG. 10. Thereafter, selective silicon deposition is performed. Once again, selective silicon epitaxy is assumed for the sake of description of the present invention. A PFET structure 509 and an NFET structure 609 in FIG. 16 are identical to their counterparts in FIG. 10 except for the labels which connote the presence of different structure only prior to that stage of processing.

From the selective silicon epitaxy process on, structures and processes are identical between the first embodiment and the third embodiment. The same holds true between the second embodiment and the fourth embodiment. Obviously, these relationships hold between the final structures as well.

According to the fifth and sixth embodiments of the present invention, the formation of the embedded Si:C alloy is performed first, followed by a selective silicon deposition process, and then an electrical doping of the source and drain regions. Once again, these embodiments also assume selective silicon epitaxy. While these embodiments are not described with figures, in is obvious that all intermediate structures before the electrical doping of the source and drain regions are not doped with dopants. Since the electrical doping of the PFETs and NFETs are performed immediately prior to the deposition of metal, the epitaxially deposited silicon material in the silicon layer is doped with electrical dopants. However, since they were deposited after the formation of silicon germanium alloys and Si:C alloys, there is no carbon or germanium in the epitaxially deposited silicon layer. So, the final structure includes unalloyed metal silicide on electrically doped silicon layer as described in Table 2 and Table 3.

Figure 17:
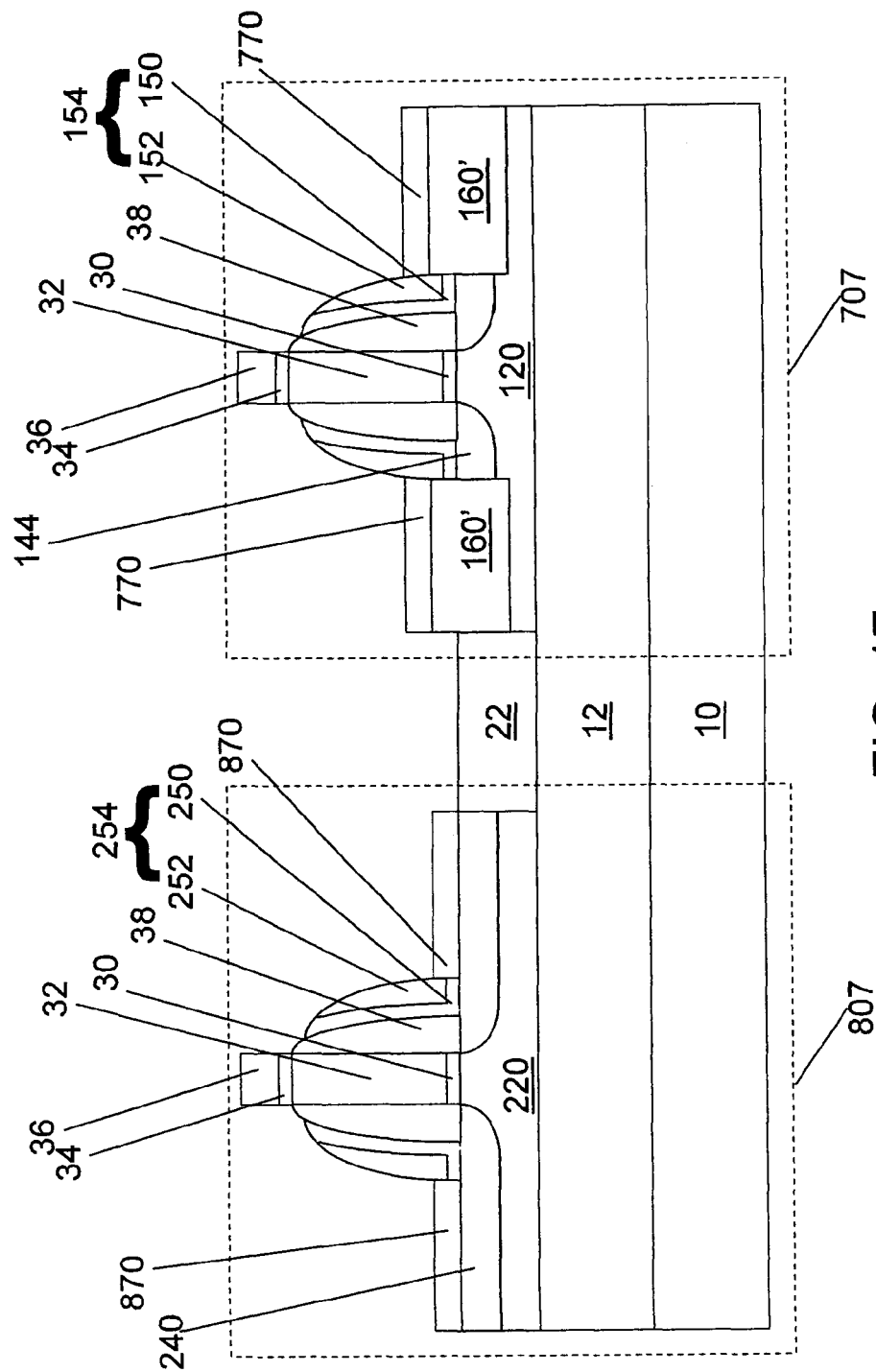
FIGS. 17-19 are sequential vertical cross-sectional views of a pair of an NFET and a PFET according to the seventh and eighth embodiments of the present invention.

According to the seventh and eighth embodiment of the present invention, the process steps are identical to those according to the first and the second embodiments up to the formation of second NFET spacers 254 as they are shown in FIG. 7. Instead of electrical doping of the source and drain regions, a selective silicon deposition is performed immediately afterward as shown in FIG. 17. A PFET structure 707 contains a newly grown silicon layer 770 over the embedded silicon germanium alloy 160' and an NFET structure 807 contains a newly grown silicon layer 870 over the regions with NFET extension implant 240.

Figure 18:
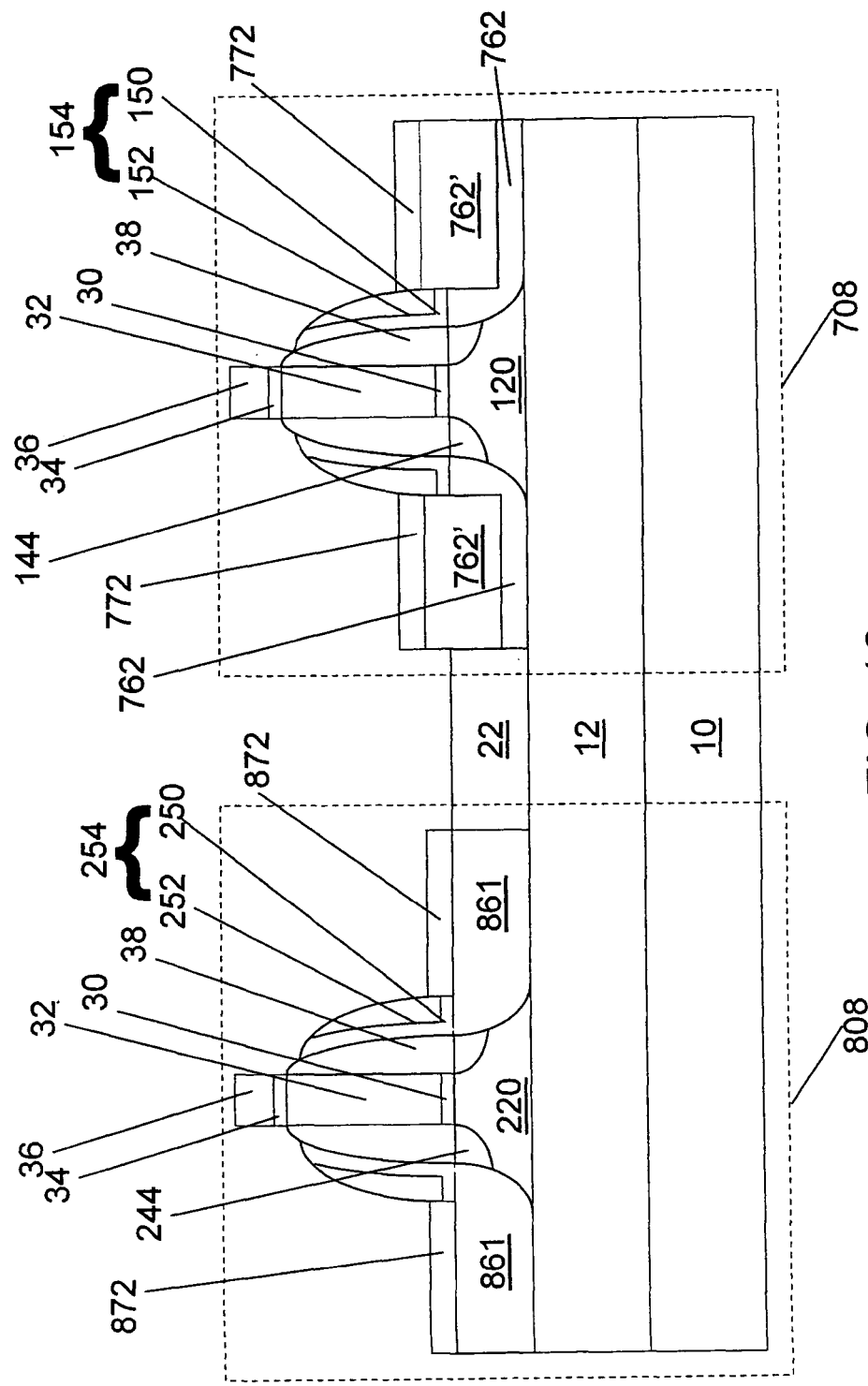

Electrical doping of the source and drain regions of the PFETs and NFETs is performed thereafter. FIG. 18 shows the resulting structures. A PFET structure 708 now contains P-doped silicon 762, P-doped silicon germanium alloy 762', and a P-doped silicon layer 772. An NFET structure 808 contains intermediate N-doped silicon 861 and an N-doped silicon layer 872. The presence of the P-doped silicon layer 772 and the N-doped silicon layer 872 are different features of the seventh and eighth embodiments compared to the first and second embodiments. N-doped Si:C alloy layer 872' is a different feature of the seventh and eighth embodiments compared to the first and second embodiments of the present invention.

Figure 19:
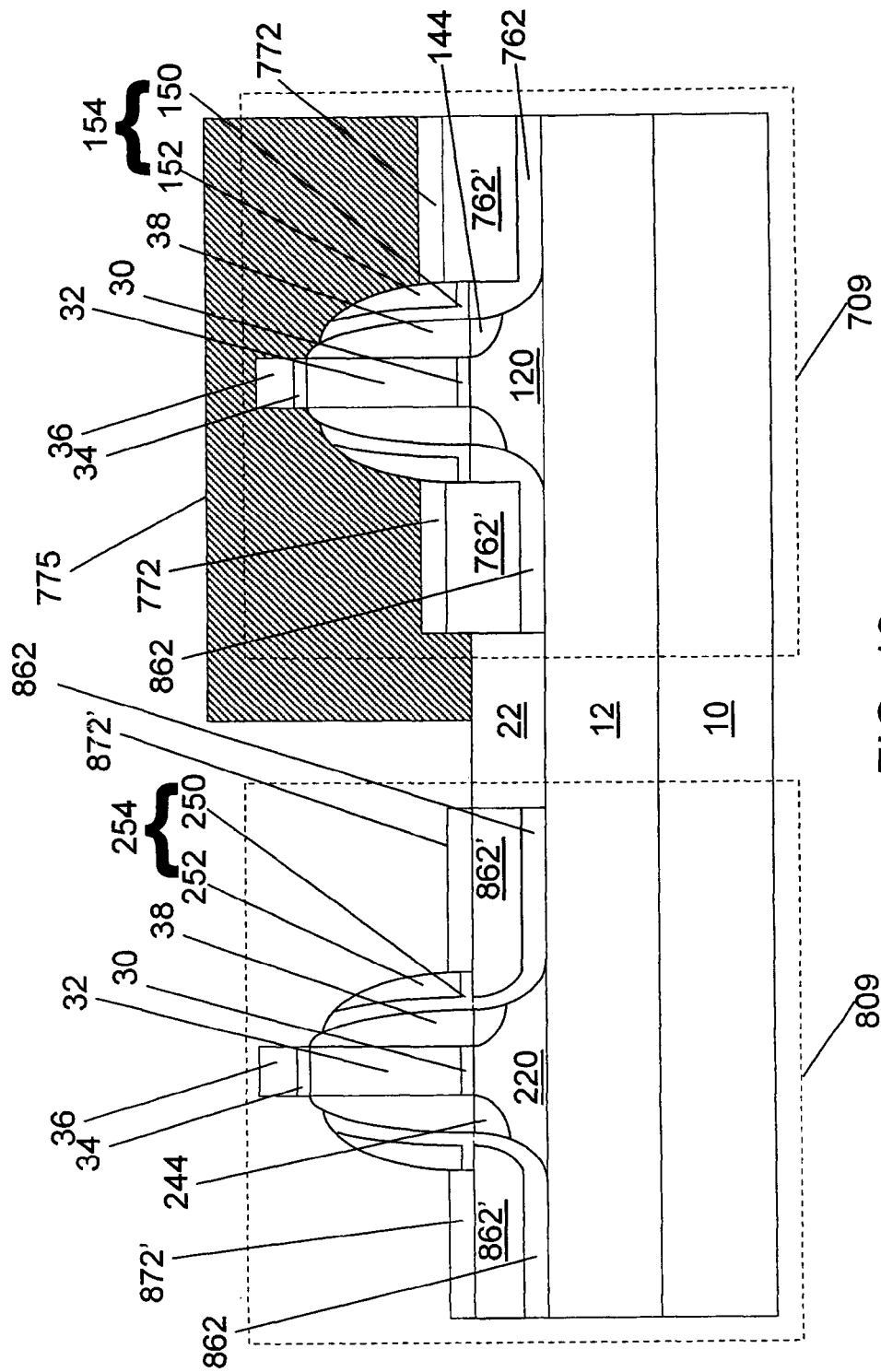

Then, a PFET structure 709 is covered with a fifth photoresist 775 and carbon is implanted into the NFET structure 809 as shown in FIG. 19. The fifth photoresist 775 is removed and the silicon substrate is subjected to an anneal process to form N-doped Si:C alloy 862' within the region of the source and the drain with carbon. Through the carbon implantation and SPE, the N-doped silicon layer 872 in FIG. 18 is converted to an N-doped Si:C alloy layer 872' in FIG. 19. The N-doped Si:C alloy layer 872' is a different feature of the seventh and eighth embodiments compared to the first and second embodiments. After the removal of the fifth photoresist 775, metal 80 is deposited in a similar manner described in FIG. 11 and then reacted with the underlying N-doped Si:C alloy layer 872' and the P-doped silicon layer.

Figure 20:
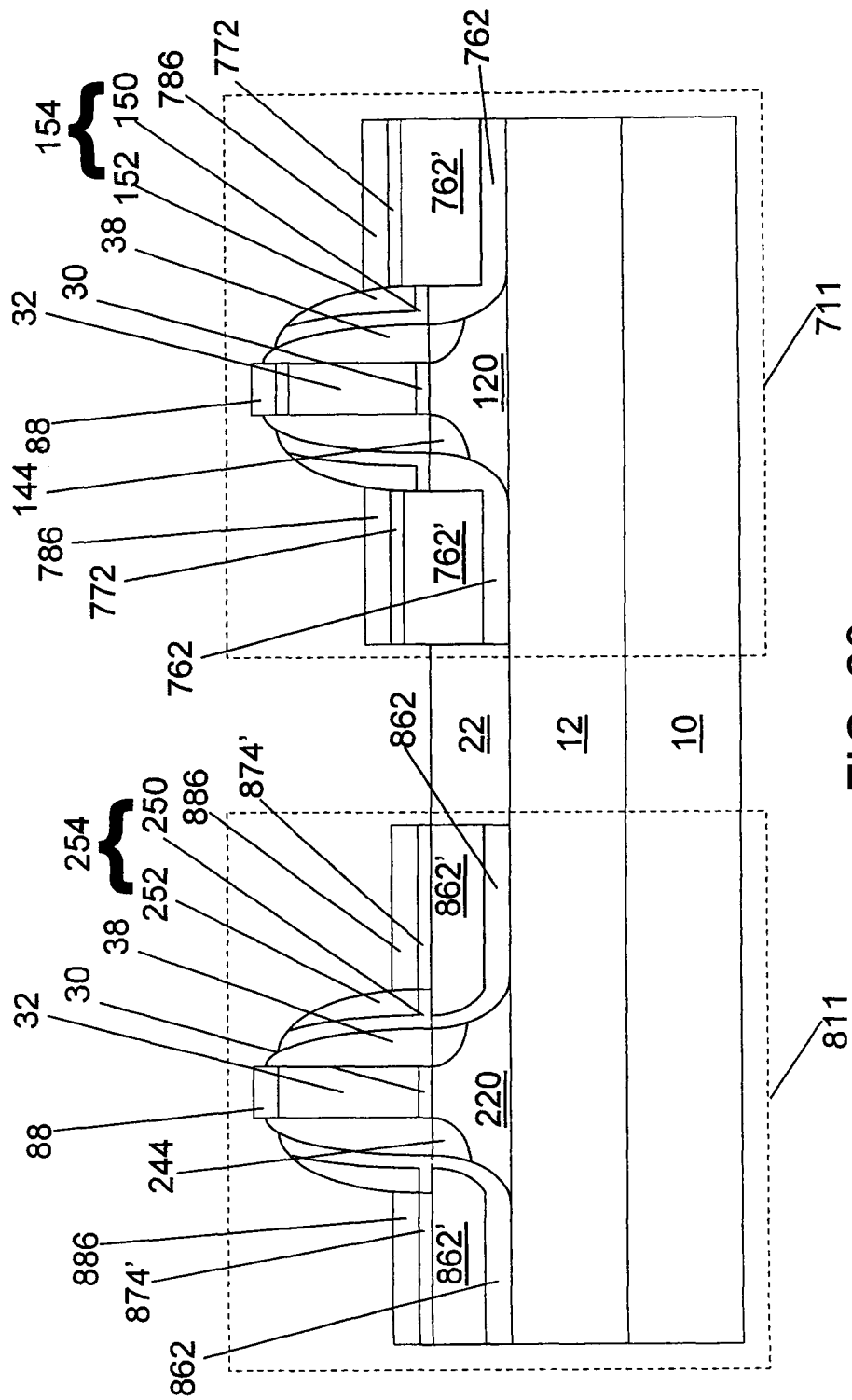
FIG. 20 is a vertical cross-sectional view of a pair of a completed NFET and a completed PFET according to the seventh embodiment of the present invention.
Figure 21:
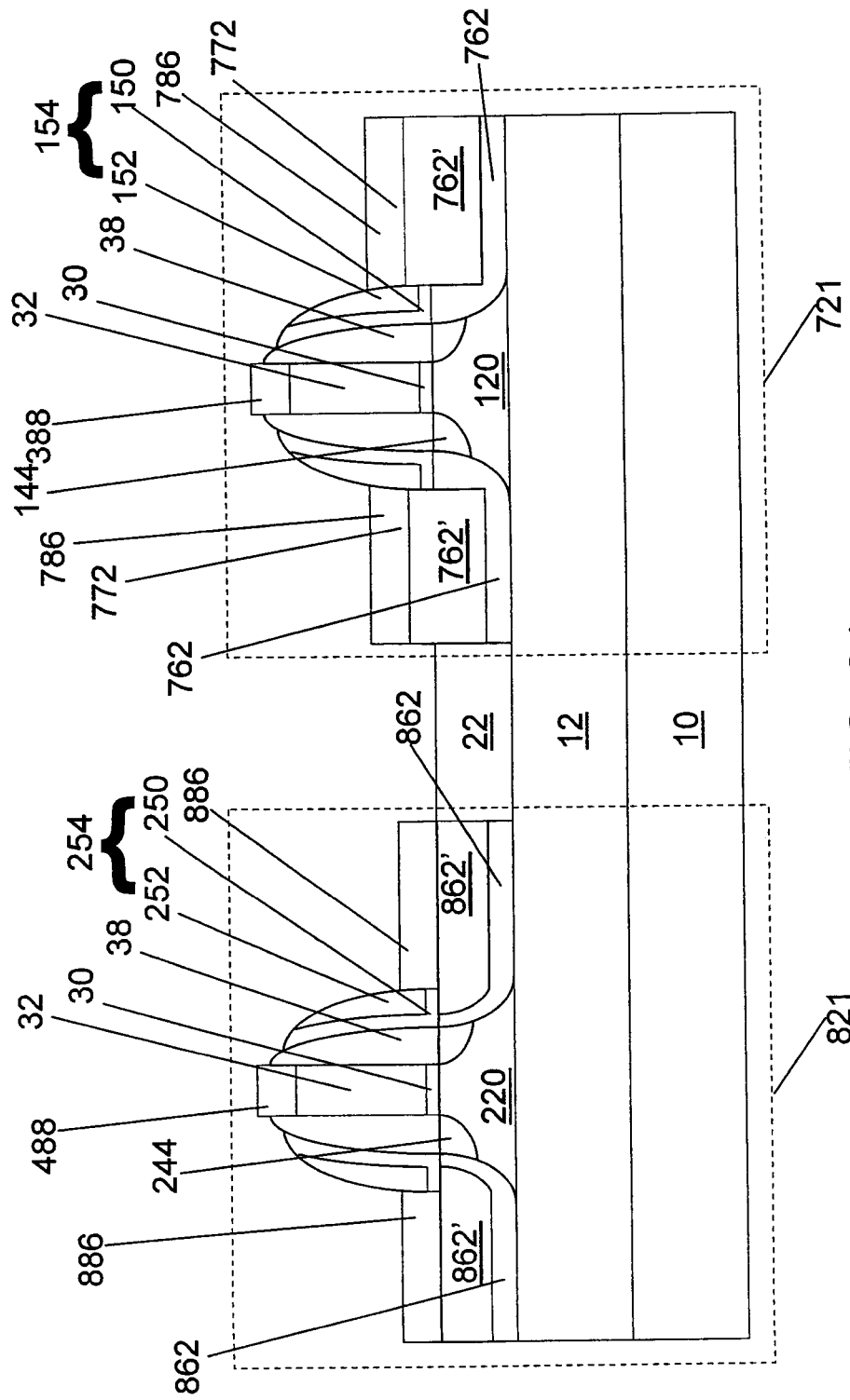
FIG. 21 is a vertical cross-sectional view of a pair of a completed NFET and a completed PFET according to the eighth embodiment of the present invention.

According to the seventh embodiment of the present invention, the reaction of the metal 80 is controlled such that the contact formation process consumes only a portion of the N-doped Si:C alloy layer 872' and the P-doped silicon layer. A PFET structure 711 and an NFET structure 811 at this stage is shown in FIG. 20. The body of the PFET 120, the PFET extension 144, the P-doped silicon 762, the P-doped silicon germanium alloy 762', and the unreacted P-doped silicon layer 772 form a contiguous single crystalline structure within each area surrounded by STI 22. Likewise, the body of the NFET 220, the NFET extension 244, the N-doped silicon 862, the N-doped Si:C alloy 862', and the unreacted N-doped silicon layer 874' form a contiguous single crystalline structure within each area surrounded by STI 22.

According to the eighth embodiment of the present invention, the reaction of the metal 80 is controlled such that the contact formation process consumes all of the N-doped Si:C alloy layer 872' and the P-doped silicon layer. A PFET structure 721 and an NFET structure 821 at this stage are shown in FIG. 20. These structures are like the corresponding structures in FIG. 20 according to the seventh embodiment but the unreacted P-doped silicon layer 772 and the unreacted N-doped silicon layer 874' are not present.

In both the seventh and eighth embodiment, since the P-doped silicon layer 772 does not contain any germanium or carbon, the contact material formed over the PFET area is unalloyed metal silicide 786 as is the case with the first through the sixth embodiments, that is, without any metal germanide, metal carbide, or carbon. However, due to the presence of carbon in the Si:C alloy layer 872', the contact material 886 formed over the NFET area is not free of carbon and metal carbide, and is therefore not an "unalloyed metal silicide" according to the definition above. It is instead an alloy of metal silicide, metal carbide, and carbon. The relative content of metal carbide and carbon may be controlled depending on the details of the process.

According to the ninth and tenth embodiment of the present invention, the process steps are identical to those according to the seventh and eighth embodiments up the selective silicon deposition as shown in FIG. 17. Instead of electrical doping of the source and drain regions thereafter, the formation of Si:C alloy is performed instead. Identical processing methods are used as in the seventh and eighth embodiments.

Figure 22:
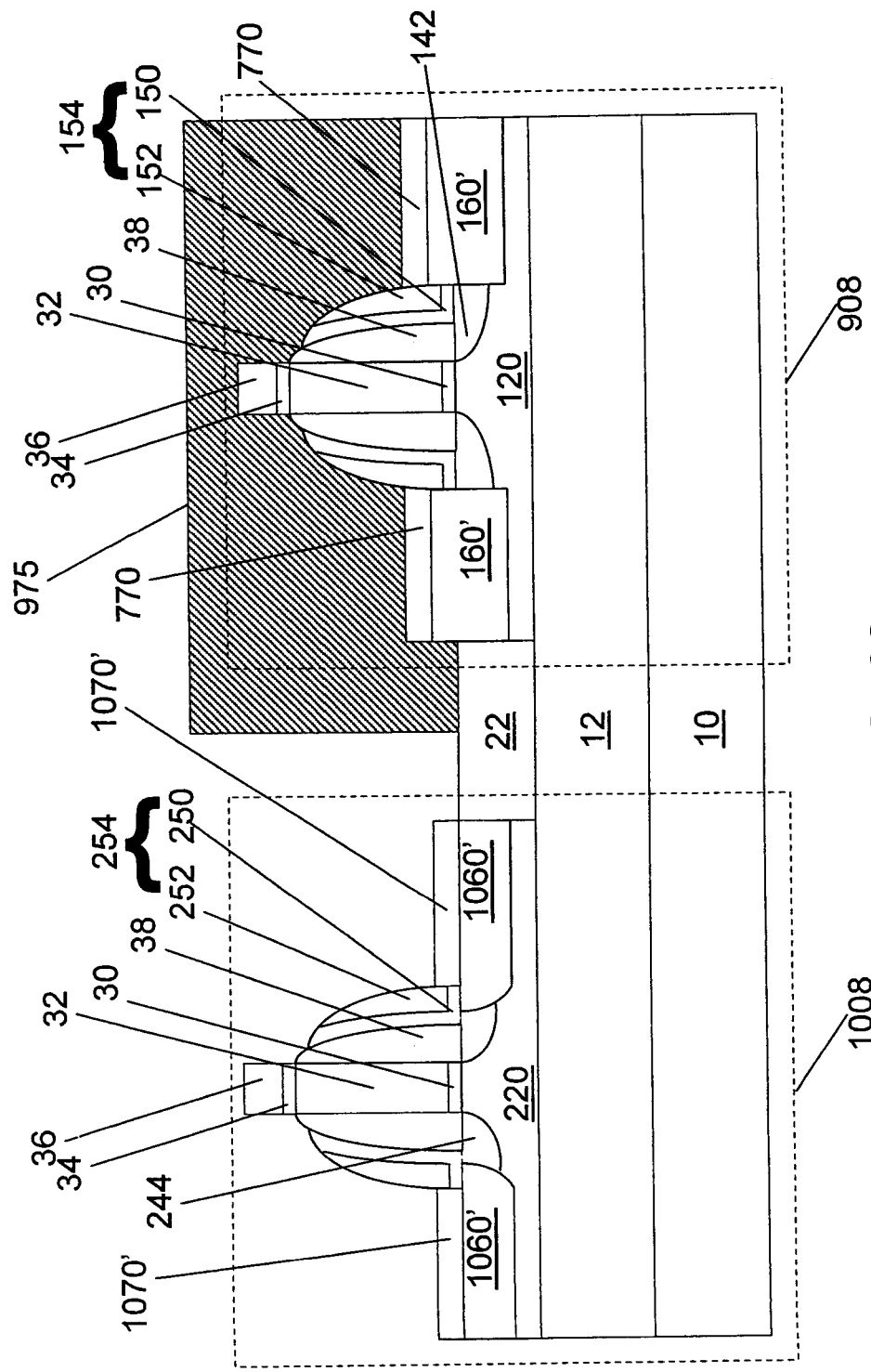
FIGS. 22-23 are sequential vertical cross-sectional views of a pair of an NFET and a PFET according to the ninth and tenth embodiments of the present invention.

As shown in FIG. 22, a PFET structure 908 is covered with a sixth photoresist 975 and carbon is implanted into the NFET structure 1008. This introduces carbon into the epitaxially grown silicon layer as well as into the silicon material from the substrate. The sixth photoresist 975 is then removed and the silicon substrate is subjected to an anneal process. The SPE during the anneal process produces Si:C alloy 1060' and an Si:C layer 1070' in the NFET structure 1008. The lack of doping in the Si:C layer 1070' in the ninth and tenth embodiment is a new feature not found in prior embodiments. Resist 975 is removed after the SPE.

Figure 23:
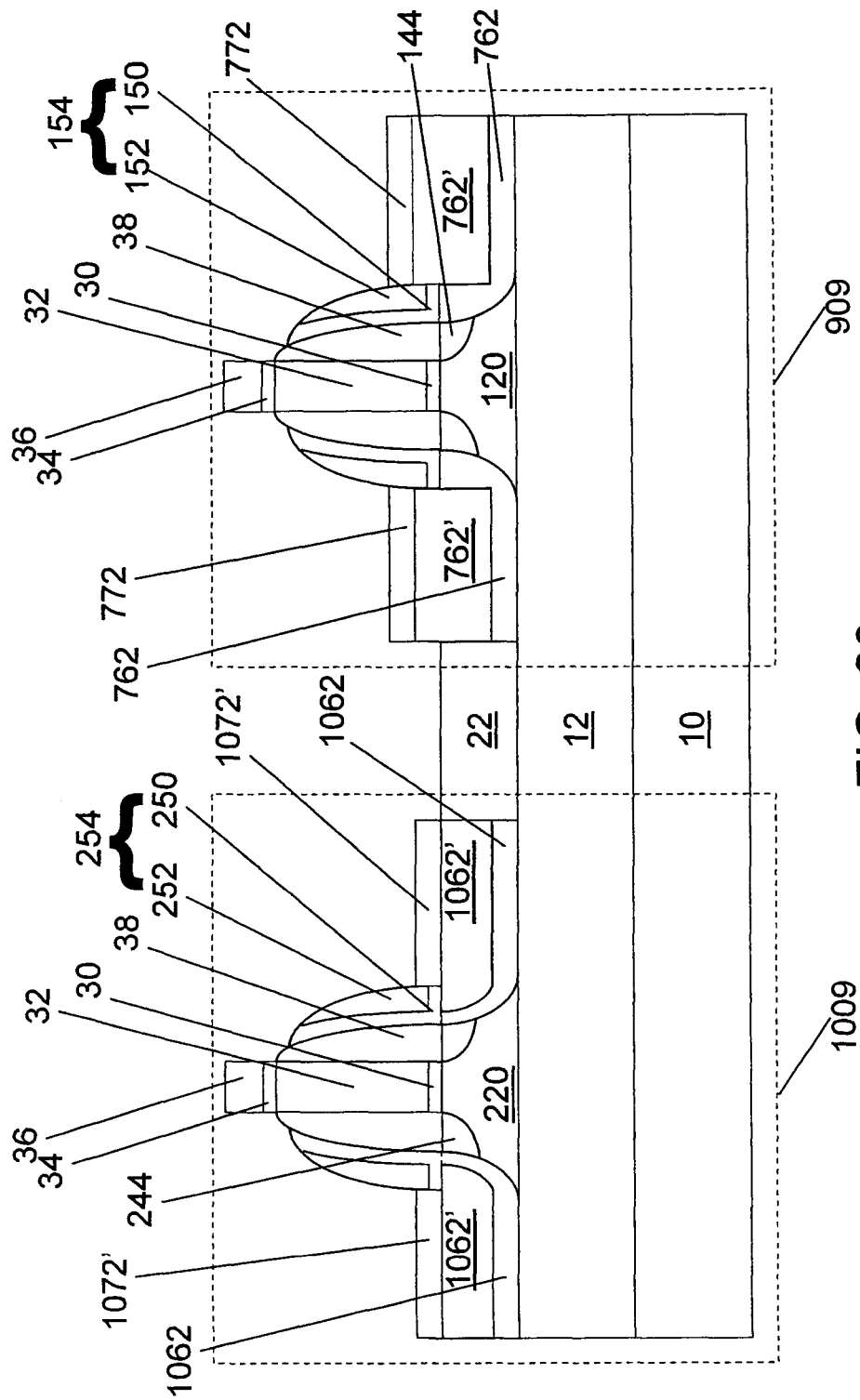

Electrical doping of the source and drain regions of the PFETs and NFETs is performed thereafter. FIG. 23 shows the resulting structures. A PFET structure 909 now contains P-doped silicon 762, P-doped silicon germanium alloy 762', and P-doped silicon layer 772. An NFET structure 1009 contains N-doped silicon 1062, N-doped Si:C alloy 1062', and N-doped Si:C alloy 1072'. The PFET structure 909 and the NFET structure 1009 at this stage according to the ninth and tenth embodiments are identical to the structures obtained after SPE according the seventh and eighth embodiments of the present invention. Subsequent processes are identical as well.

According to the ninth embodiment, the reaction of the metal with the underlying semiconductor material is controlled in an identical manner to that according to the seventh embodiment, and consequently, identical structure results in the end. The same relationship holds true between the eighth embodiment and the tenth embodiment.

According to the eleventh and twelfth embodiments, the electrical doping of the source and drain regions follow the formation of silicon germanium alloy. Thereafter, a selective silicon epitaxy and a formation of Si:C follows sequentially. The resulting structure produces contact material that the seventh through tenth embodiments of the present invention produces with the only difference being that the contact material has less electrical dopants, which is insignificant for the performance of the contact material.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure comprising:
   providing a semiconductor substrate with a PFET area and an NFET area;
   masking said PFET area with a mask;
   forming an embedded silicon carbon alloy in source and drain regions in said NFET area;
   growing, by selective deposition of a silicon material, a silicon layer in said PFET area and NFET area, wherein said silicon layer is present on said embedded silicon carbon alloy layer in said source and drain regions in said NFET area, and said silicon layer is present on source and drain regions in said PFET area, and said silicon layer is essentially free of carbon and germanium;
   depositing a metal on said silicon layer; and
   reacting said silicon layer with said metal to form a contact material of a metal silicide essentially free of carbon.

2. The method of claim 1, wherein a portion of said silicon layer is consumed to form said metal silicide, while a remaining portion of said silicon layer is not consumed during the formation of said contact material.

3. The method of claim 1, wherein the step of forming an embedded silicon carbon alloy in source and drain regions in said NFET area further includes:
   implanting carbon into said source and drain regions of said NFET area; and
   regrowing, by solid phase epitaxy, a silicon carbon alloy in said source and drain regions of said NFET area.

4. The method of claim 1, wherein said solid phase epitaxy is performed through a laser anneal process, wherein a peak temperature is between 700° C. and 1428° C.

5. The method of claim 1, wherein said selective deposition of silicon is performed by selective epitaxy of silicon.

6. The method of claim 1, further comprising implanting of dopants into at least one of said source and drain regions of said PFET area and said source and drain regions of said NFET area after providing said semiconductor substrate with said PFET area and said NFET area and before masking said PFET area with said mask.

7. The method of claim 1, wherein said metal is selected from nickel, nickel platinum alloy, cobalt, tantalum, tungsten, molybdenum, and titanium.

8. A method of manufacturing a semiconductor structure comprising:
   providing a semiconductor substrate with a PFET area and an NFET area;
   masking said PFET area with a mask;
   forming an embedded silicon carbon alloy in source and drain regions in said NFET area;
   implanting of dopants into at least one of said source and drain regions of said PFET area and said source and drain regions of said NFET area after forming said embedded silicon carbon alloy in said source and drain regions in said NFET area;
   growing, by selective deposition of a silicon material, a silicon layer in said PFET area and NFET area after said implanting of dopants, wherein said silicon layer is essentially free of carbon and germanium;
   depositing a metal on said silicon layer; and
   reacting said silicon layer with said metal to form a contact material.

9. The method of claim 8, wherein a portion of said silicon layer is consumed to form a metal silicide, while a remaining portion of said silicon layer is not consumed during the formation of said contact material.

10. The method of claim 8, wherein the step of forming an embedded silicon carbon alloy in source and drain regions in said NFET area further includes:
    implanting carbon into said source and drain regions of said NFET area; and
    regrowing, by solid phase epitaxy, a silicon carbon alloy in said source and drain regions of said NFET area.

11. The method of claim 8, wherein said solid phase epitaxy is performed through a laser anneal process, wherein a peak temperature is between 700° C. and 1428° C.

12. The method of claim 8, wherein said selective deposition of silicon is performed by selective epitaxy of silicon.

13. The method of claim 8, further comprising implanting of dopants into at least one of said source and drain regions of said PFET area and said source and drain regions of said NFET area after providing said semiconductor substrate with said PFET area and said NFET area and before masking said PFET area with said mask.

14. The method of claim 8, wherein said metal is selected from nickel, nickel platinum alloy, cobalt, tantalum, tungsten, molybdenum, and titanium.

* * * * *